United States Patent
Egawa

(10) Patent No.: US 8,547,472 B2
(45) Date of Patent: Oct. 1, 2013

(54) IMAGE PICKUP DEVICE AND CAMERA MODULE USING THE SAME

(75) Inventor: Yoshitaka Egawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 90 days.

(21) Appl. No.: 13/187,725

(22) Filed: Jul. 21, 2011

(65) Prior Publication Data

US 2011/0273596 A1 Nov. 10, 2011

Related U.S. Application Data

(62) Division of application No. 12/134,680, filed on Jun. 6, 2008, now Pat. No. 8,013,928.

(30) Foreign Application Priority Data

Jun. 7, 2007 (JP) ................................. 2007-151745

(51) Int. Cl.
*H04N 5/232* (2006.01)
*H04N 5/335* (2011.01)
*H04N 5/225* (2006.01)

(52) U.S. Cl.
USPC ............ 348/340; 348/345; 348/272; 348/273

(58) Field of Classification Search
USPC .................. 348/345, 272, 340, 273; 358/482
See application file for complete search history.

(56) References Cited

U.S. PATENT DOCUMENTS

| | | | |
|---|---|---|---|
| 5,307,159 A | 4/1994 | Hieda | |
| 6,570,616 B1 * | 5/2003 | Chen | 348/272 |
| 7,911,507 B2 | 3/2011 | Egawa et al. | |
| 2006/0066922 A1 * | 3/2006 | Nishi | 358/482 |
| 2006/0268143 A1 | 11/2006 | Boettiger et al. | |
| 2007/0085924 A1 | 4/2007 | Oshima et al. | |
| 2007/0177481 A1 | 8/2007 | Kimura et al. | |
| 2007/0257998 A1 * | 11/2007 | Inoue | 348/272 |
| 2008/0068477 A1 | 3/2008 | Iida et al. | |
| 2008/0180556 A1 | 7/2008 | Egawa | |
| 2008/0180577 A1 | 7/2008 | Egawa et al. | |

(Continued)

FOREIGN PATENT DOCUMENTS

| | | |
|---|---|---|
| JP | 4-235472 | 8/1992 |
| JP | 5-168029 | 7/1993 |

(Continued)

OTHER PUBLICATIONS

Japanese Office Action issued Feb. 28, 2012, in Patent Application No. 2008-150983 (with English-language translation).

*Primary Examiner* — Tuan Ho
*Assistant Examiner* — Quang Le
(74) *Attorney, Agent, or Firm* — Oblon, Spivak, McClelland, Maier & Neustadt, L.L.P.

(57) ABSTRACT

An image pickup device includes a signal processing unit which processes a signal generated by separating a luminous signal into wavelength components of two or more colors by use of a sensor unit including two-dimensionally arranged pixels to which a wavelength separating unit for separating light wavelengths is arranged at a front face of a photoelectric converting element which converts the luminous signal condensed by an optical lens unit into electric signals, wherein the optical lens unit includes at least one optical lens having different focusing positions in accordance with the wavelengths of the luminous signal, and the signal processing unit includes an outline signal generating unit which extracts an outline signal from an output signal of the sensor unit.

8 Claims, 21 Drawing Sheets

(56) References Cited

U.S. PATENT DOCUMENTS

| | | |
|---|---|---|
| 2010/0123809 A1 | 5/2010 | Egawa |
| 2010/0157091 A1 | 6/2010 | Honda et al. |
| 2010/0315541 A1 | 12/2010 | Egawa |

FOREIGN PATENT DOCUMENTS

| | | |
|---|---|---|
| JP | 8-288482 | 11/1996 |
| JP | 11-26737 | 1/1999 |
| JP | 2000-260968 | 9/2000 |
| JP | 2001-245307 | 9/2001 |
| JP | 2002-10108 | 1/2002 |
| JP | 2002-135792 | 5/2002 |
| JP | 2003-131138 | 5/2003 |
| JP | 2005-303731 | 10/2005 |
| JP | 2007-47228 | 2/2007 |
| JP | 2007-104178 | 4/2007 |
| WO | WO 2006/064564 A1 | 6/2006 |

\* cited by examiner

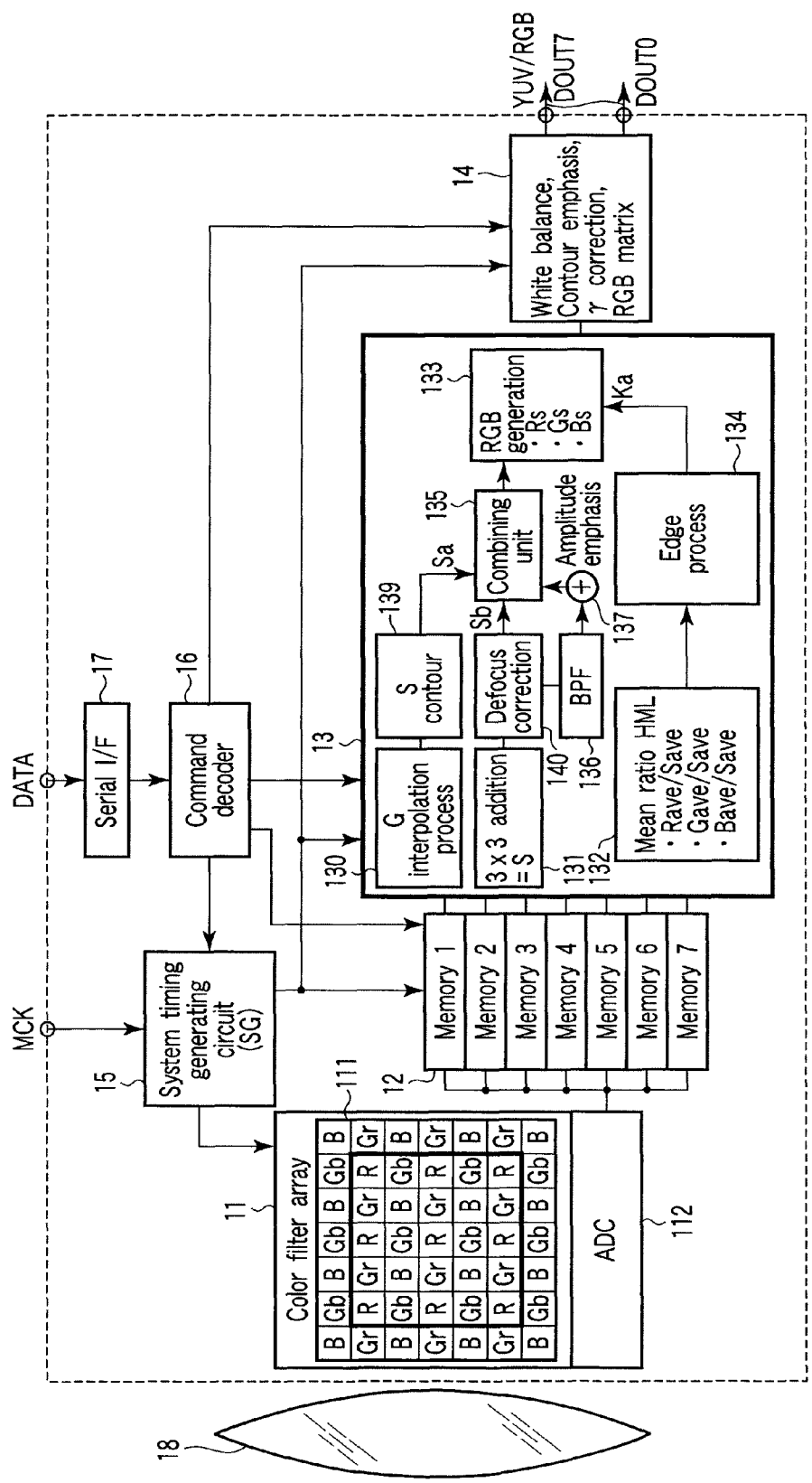
F I G. 1

| G11 | g12 | G13 | g14 | G15 |
|---|---|---|---|---|
| g21 | G22 | g23 | G24 | g25 |
| G31 | g32 | G33 | g34 | G35 |
| g41 | G42 | g43 | G44 | g45 |
| G51 | g52 | G53 | g54 | G55 |

\*

| −1 | −1 | −1 |
|---|---|---|
| −1 | 8 | −1 |
| −1 | −1 | −1 |

= G33'

P32 P31

F I G. 3

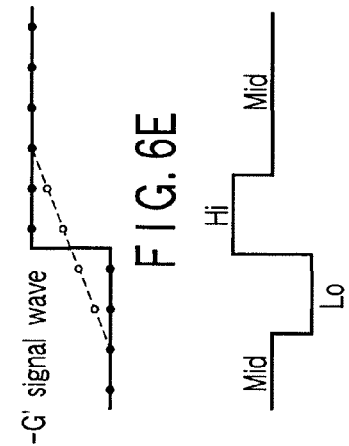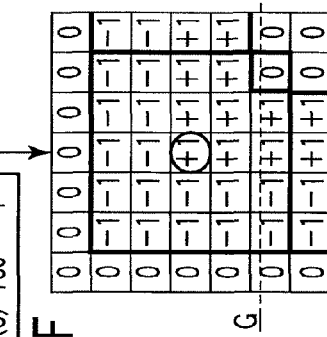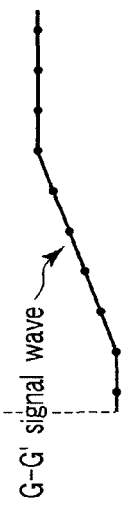

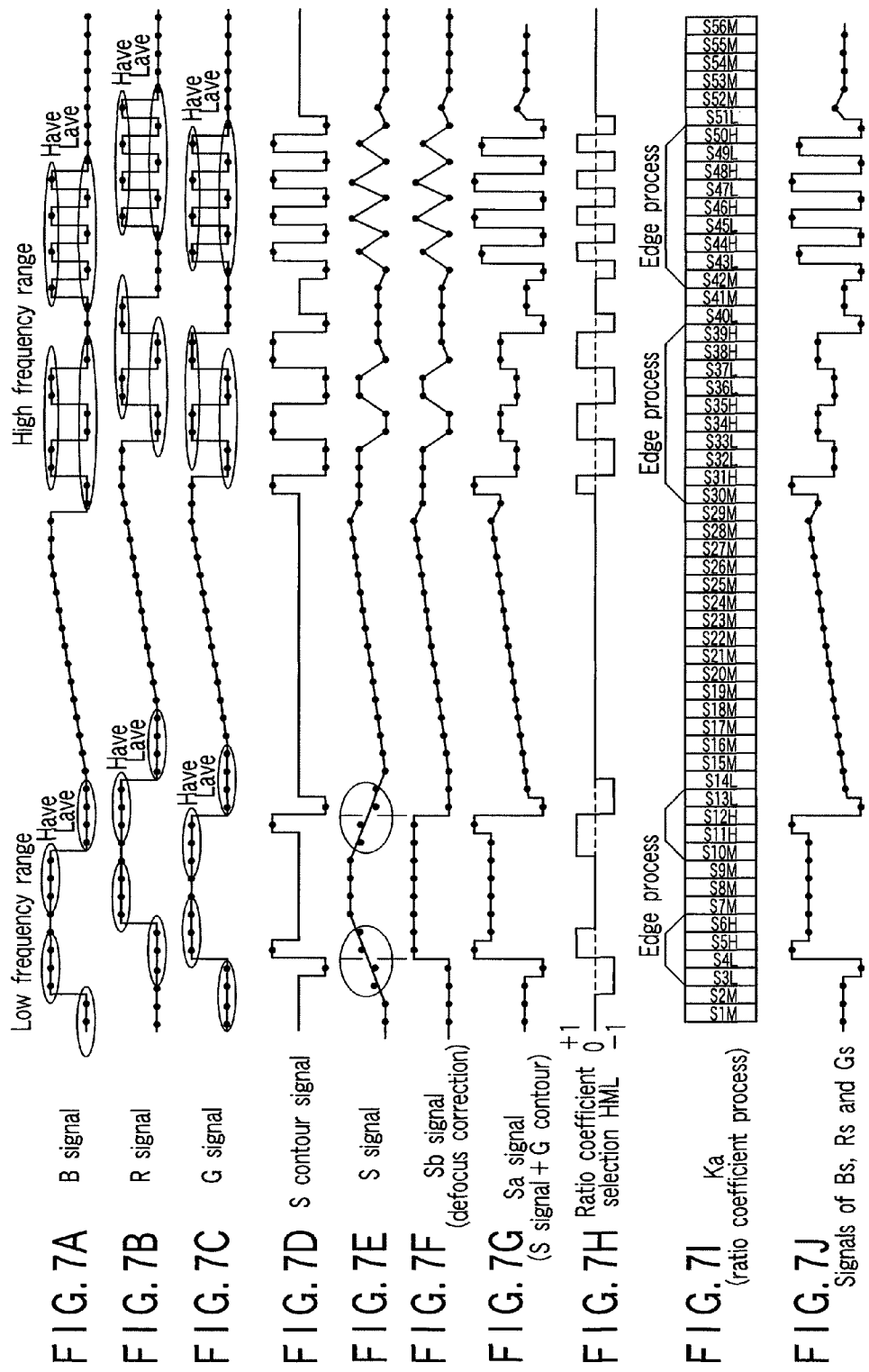

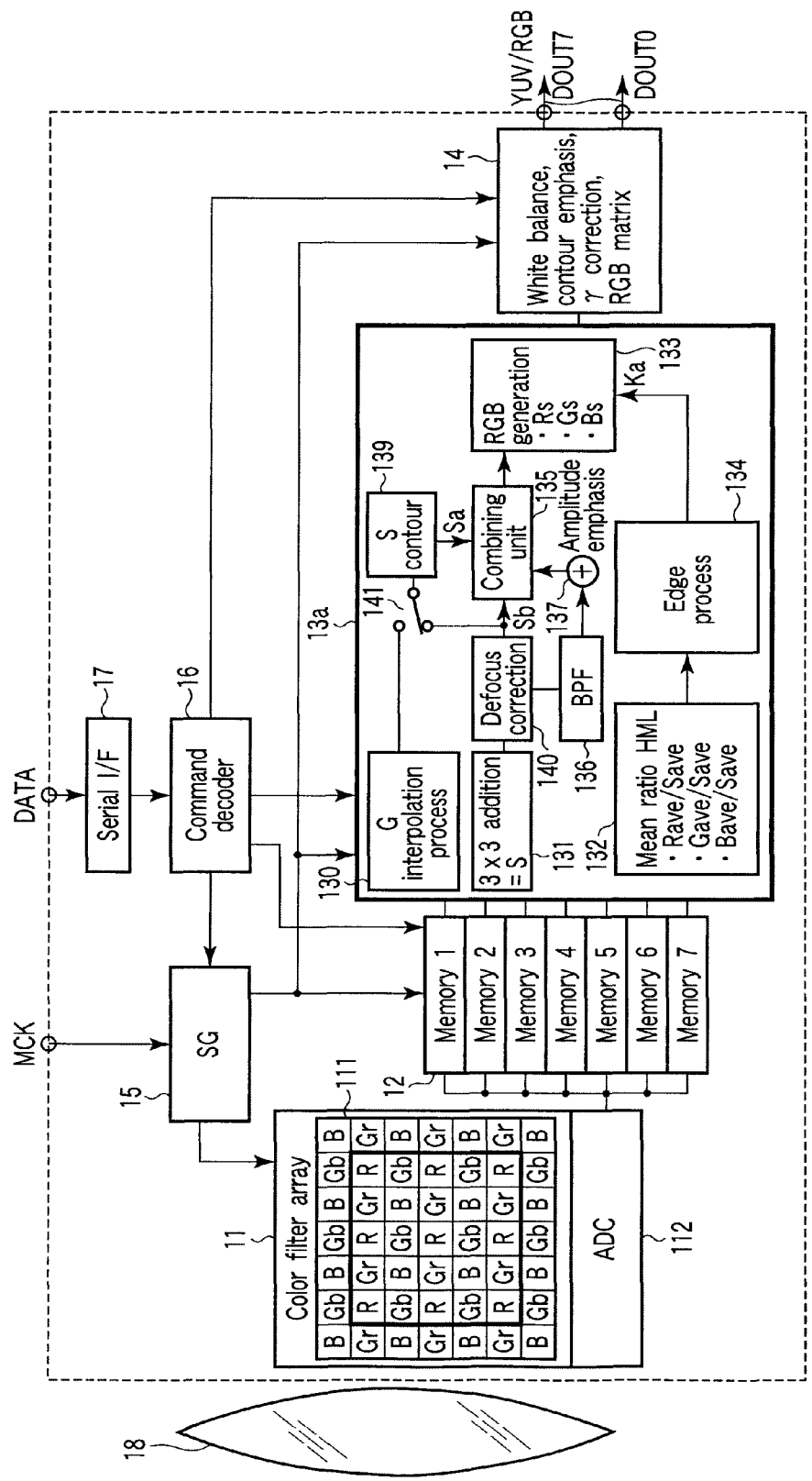
F I G. 9

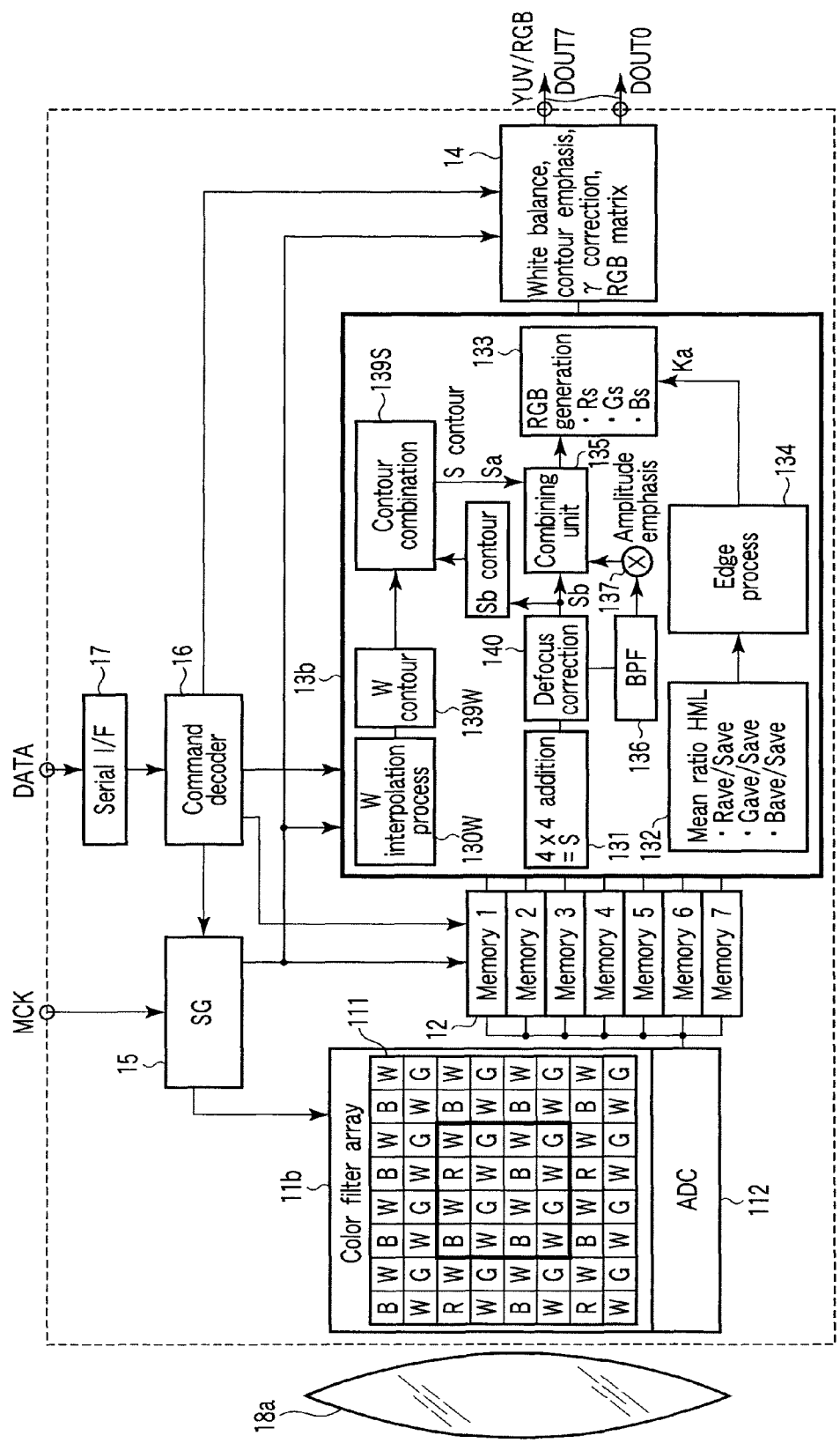
F I G. 13

| W | R | W | B |
|---|---|---|---|
| G | W | G | W |
| W | B | W | R |
| G | W | G | W |
P141
F I G. 14
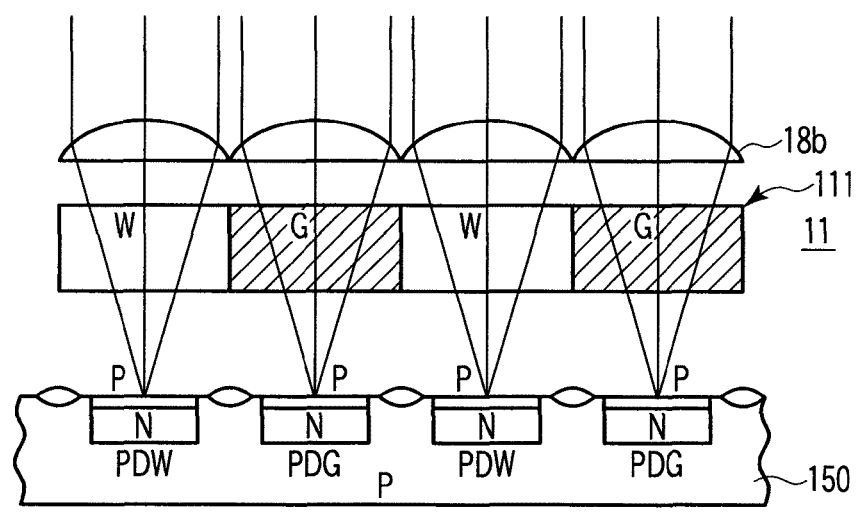
F I G. 15

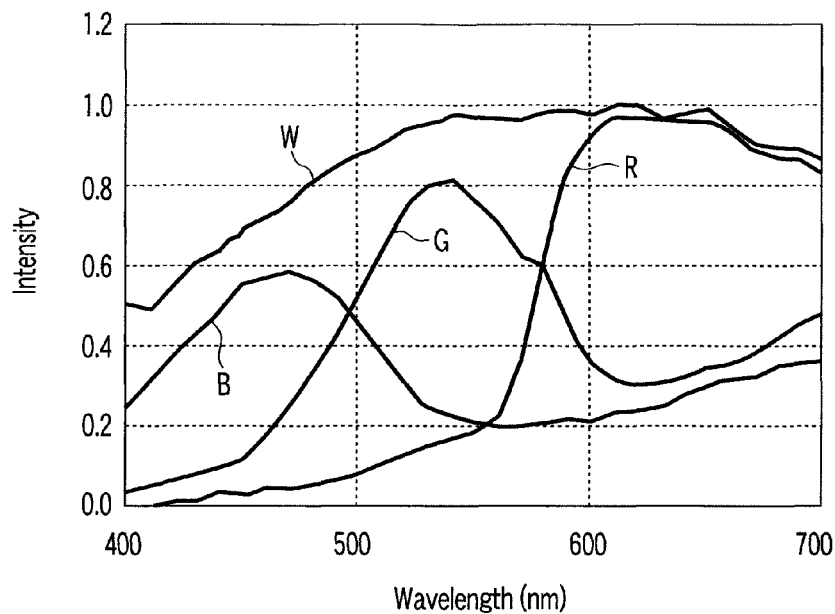
FIG. 16
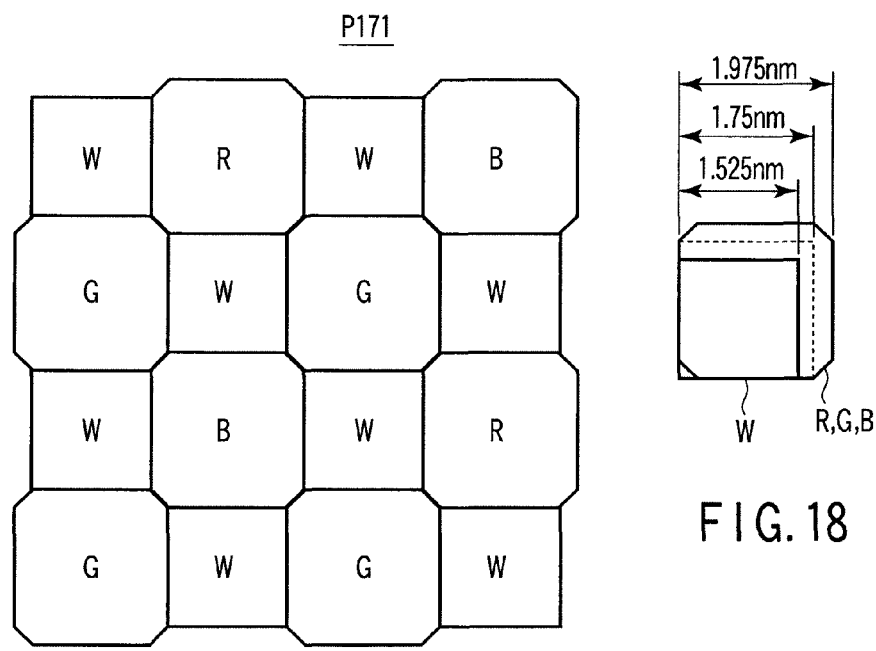
FIG. 17
FIG. 18

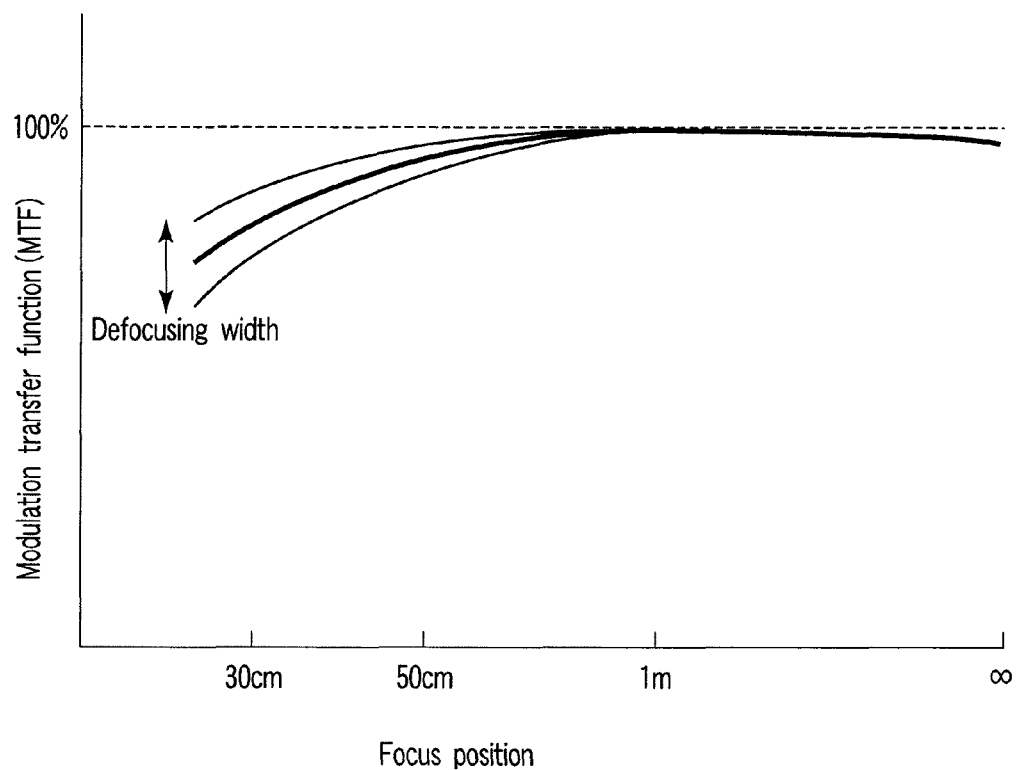
F I G. 26

IMAGE PICKUP DEVICE AND CAMERA MODULE USING THE SAME

CROSS-REFERENCE TO RELATED APPLICATIONS

This application is a division of and claims the benefit of priority under 35 U.S.C. §120 from U.S. Ser. No. 12/134,680 filed Jun. 6, 2008, and claims the benefit of priority under 35 U.S.C. §119 from Japanese Patent Application No. 2007-151745 filed Jun. 7, 2007, the entire contents of each of which are incorporated herein by reference.

BACKGROUND OF THE INVENTION

1. Field of the Invention

The present invention relates to an image pickup device and a camera module configured by using the image pickup device, and in particular, relates to signal processing for generating RGB signals based on an RGB color ratio correlation. For example, the image pickup device is utilized in a solid-state image pickup device such as a charge-coupled device (CCD) image sensor and a CMOS type image sensor, a cellular phone with an image sensor, a digital camera, a video camera and the like.

2. Description of the Related Art

Recently, pixels of an image sensor are expedited to be fine, and the pixel pitch of the 2 μm range is in practical use. Further, the pixel pitch of 1.75 μm and that of 1.4 μm are under development. With the fine pixel which pitch is equal to or less than 2 μm, S/N of image signals deteriorates because the amount of incident light at a receiving surface thereof is greatly reduced. Further, conventionally, a color camera has a problem that the image quality deteriorates due to a false color signal or a color noise which is caused by refractive index difference at the time of passing through a lens generated by light wavelength difference of RGB or the miniaturization of the pixel pitch. Regarding the suppression of the false color signal or the reduction of the color noise, a variety of measures have been proposed.

See, for example, Jpn. Pat. Appln. KOKAI Publication Nos. 4-235472, 2002-10108, 2005-303731, 2001-245307, and 5-168029.

However, a radical solution is not proposed in these measures.

Further, with a single plate color camera, for example, the image quality deteriorates due to the generation of an RGB color drift which is a false color at an edge portion of an object image or due to a dot-shaped color noise caused by a random noise of each RGB.

There are two generation factors of the false color signal. Regarding one factor, there is a generation of a beat at the vicinity of critical resolution of a sensor due to a mismatch between the pitch of the pixel and the pitch of the high resolution pattern of an object. Since the frequency of the beat is low, the false color signal is caused by mixing of a low frequency component into the frequency of the captured signal. Regarding the other factor, as mentioned above, the refractive indexes of RGB lights differ because of the wavelength difference of the RGB lights which are incident into an optical lens, and then, the false color signal is caused by chromatic aberration in magnification where the RGB images drift at the periphery area of the sensor.

As shown in FIG. 24, the chromatic aberration in magnification becomes large especially at the periphery area of the sensor. Further, as making the F value of the lens small in order to correspond to the fine pixel of the sensor and as the higher the spatial frequency corresponding to the pixel pitch becomes, the larger the chromatic aberration on the axis becomes even at the center of the lens due to the difference in decrease of modulation degree of a transfer function MTF (Modulated Transfer Function) of RGB lights. Therefore, with the fine pixel, the deterioration of the image quality is significant.

FIGS. 25A and 25B respectively show an obtained image when shooting red characters and the signal wave-shapes corresponding thereto. FIG. 25A shows a defocused image which is shot in the state that an objective lens is defocused and the signal wave-shape thereof. FIG. 25B shows an image with which the objective lens is focused and the signal wave-shape thereof. In the defocused image in FIG. 25A, the signal wave-shape corresponding to the edge portion of the displayed character gradually varies, and phases of a G signal and a B signal drift due to the chromatic aberration. Therefore, false color development occurs at the edge portion. This defocused image easily occurs especially with a fixed focus type objective lens.

FIG. 26 shows modulation degree characteristics of MTF in the condition that the focus position is adjusted at 1 m or longer with a fixed focus lens. As shown in FIG. 26, when the focus position is adjusted at a distance of 1 m or longer from the lens, the close object which is at the distance of less than 1 m cannot be focused. The shorter the distance becomes, the more the defocusing width increases. Then, signal defocusing occurs caused by the decrease of modulation degree and the chromatic aberration shown in FIG. 24. The defocusing width corresponds to the inclination amount of the signal wave-shape from the vertical position. On the contrary, when the focus is adjusted to a close object which positions, for example, at 30 cm from the lens, image defocusing occurs with the far object which positions at 1 m or farther from the lens. Further, even with the image where the object is focused, the chromatic aberration (the chromatic aberration in magnification) easily occurs at the periphery of the sensor, namely the periphery area of the lens, as shown in FIG. 24. Furthermore, as mentioned above, there is a case that false color development occurs due to the chromatic aberration on the axis even at the center of the lens.

In addition, in a prior art disclosed in WO2006095110, a solid-state image pickup device which deepens the depth of field is disclosed. However, there is a problem that a false color occurs to the image since no solution to the problems of the chromatic aberration of the lens is taken. Then, even if measures against the above-mentioned problem are taken, the device cannot be adapted to a variety of object conditions, and thus, efficient resolution and resolution feeling and a correct color replay image cannot be obtained.

BRIEF SUMMARY OF THE INVENTION

An image pickup device according to one embodiment of the present invention comprises a signal processing unit for processing a signal generated by separating a luminous signal into wavelength components of two or more colors by use of a sensor unit comprising two-dimensionally arranged pixels to which a wavelength separating unit for separating light wavelengths is arranged at a front face of a photoelectric converting element which converts the luminous signal condensed by an optical lens unit into electric signals, wherein the optical lens unit comprises at least one optical lens having different focusing positions in accordance with the wavelengths of an incident light, and the signal processing unit comprises an outline signal generating unit for extracting an outline signal from an output signal of the sensor unit.

BRIEF DESCRIPTION OF THE SEVERAL VIEWS OF THE DRAWING

FIG. 1 is a block diagram showing a general configuration of a CMOS image sensor of an image pickup device according to a first embodiment of the present invention;

FIG. 3 is a diagram showing an example of a method for generating a G outline signal in the color correlation RGB generating circuit in FIG. 1;

FIG. 6A is a diagram showing an array of an addition signal of the sensor unit and a signal image in order to show an example of a defocus correcting process for a first addition signal S in the color correlation RGB generating circuit in FIG. 1;

FIG. 6B is a diagram showing a signal of a 3×3 pixel of the sensor unit in FIG. 6A;

FIG. 6C is a diagram showing a condition of determining an inclination of the addition signal;

FIG. 6D is a diagram showing an array of the result data of the inclination determination;

FIG. 6E is a diagram showing an example of a signal wave obtained by the inclination determination;

FIG. 6F is a diagram showing an example of a method of determining a ratio coefficient;

FIG. 6G is a diagram showing an array of the determination result of the ratio coefficient;

FIG. 6H is a diagram showing an example of a signal wave determined in the sensor unit;

FIGS. 7A to 7J are diagrams respectively showing the signal of each unit of the CMOS image sensor shown in FIG. 1 in accordance with the signal process flow;

FIGS. 8A and 8B are diagrams each showing an example of a method for emphasizing signal amplitude of the midrange of a first addition signal S in the color correlation RGB generating circuit in FIG. 1;

FIG. 9 is a block diagram showing a general configuration of a CMOS image sensor according to a second embodiment of the present invention;

FIG. 13 is a block diagram showing a general configuration of a CMOS image sensor according to a fourth embodiment of the present invention;

FIG. 14 is a diagram showing another example of a color filter array of WRGB in the sensor unit in FIG. 13;

FIG. 15 is a sectional view of a pixel in FIG. 14;

FIG. 16 is a diagram showing an example of spectral characteristics of a color filter shown in FIG. 15;

FIG. 17 is a plane view of a pixel of an image sensor according to a fifth embodiment of the present invention;

FIG. 18 is a diagram showing the relation in magnitude of pixel areas in FIG. 17;

FIG. 26 is a diagram showing modulation degree (MFT) characteristics in the condition that the focus is adjusted at 1 m or longer utilizing a fixed focus lens.

DETAILED DESCRIPTION OF THE INVENTION

Figures 2A, 2B:
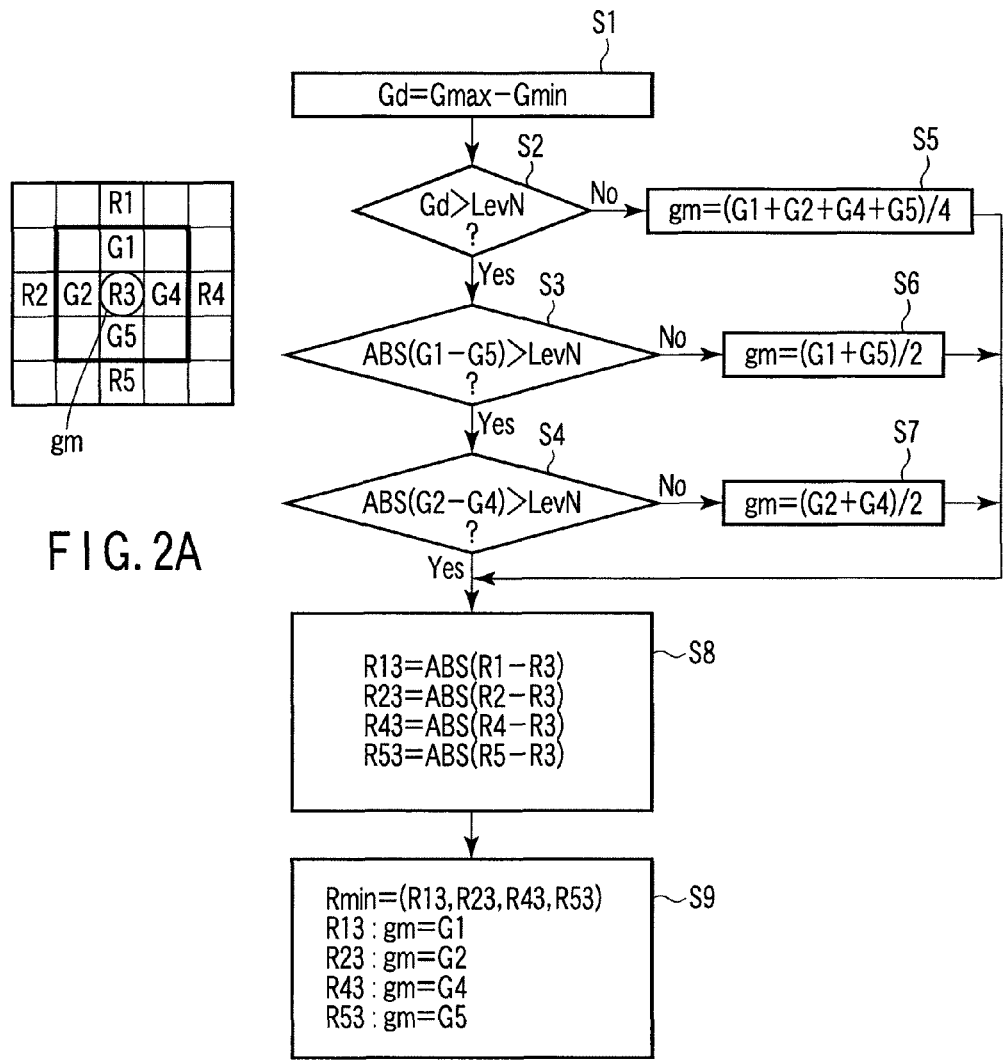
FIG. 2A is a diagram showing a 3×3 pixel array of a sensor unit in FIG. 1.
FIG. 2B is a flow chart showing an example of a method for performing an interpolation process of a G signal in a color correlation RGB generating circuit in FIG. 1.

In the following, as embodiments of an image pickup device according to the present invention, a case that the present invention is adapted to a CMOS image sensor will be described by way of example with reference to the drawings. In the description, the same reference numeral is given to the same part in all drawings.

<First Embodiment>

FIG. 1 is a block diagram showing a general configuration of a CMOS image sensor according to a first embodiment together with a lens. The CMOS image sensor includes a sensor unit 11, a line memory 12, a color correlation RGB generating circuit 13, a signal processing circuit 14, a system timing generating circuit (SG) 15, a command decoder 16, and a serial interface (Serial I/F) 17. Reference numeral 18 is a lens which inputs a condensed luminous signal to the sensor unit 11.

A pixel portion 111 and a column type analog digital converter (ADC) 112 are arranged in the sensor unit 11. The pixel portion 111 has an array where the pixels are two-dimensionally arranged on a semiconductor substrate as rows and columns. Each pixel is constituted of photoelectric converting means (a photodiode, for example) and a color filter. The color filters for 3 colors, R (Red), G (Green), and B (Blue), are arranged at a front face of a receiving surface of the photodiode. Here, the color filters having a Beyer array of RGB primary-colors are utilized as the color filter array.

The sensor potion 11 separates a luminous signal of an object input through the lens 18 into luminous signals of RGB components by the color filter and generates signal charge at the photodiode array by means of photoelectric conversion. The signal charge is transformed to a digital signal (R signal, G signal and B signal) and output by the column type ADC 112. The signal output from the sensor unit 11 is input to the line memory 12. Here, the color filter array is arranged to be parallel in 7 lines against the ADC 112. Therefore, the sensor output is sequentially output from the photodiode array of 7 lines corresponding to the color filter of 7 lines in accordance with the clock of the system timing generating circuit 15. Then, the sensor output is sequentially stored in the line memory 1 through the line memory 7 which are the 7 lines of the line memory 12. The signals stored in the memory 1 through the memory 7 are output to the color correlation RGB generating circuit 13 sequentially in parallel in accordance with the clock of the system timing generating circuit 15.

The color correlation RGB generating circuit 13 includes a first adding unit 131, a mean ratio calculating unit 132, a RGB generating unit 133, an edge processing unit 134, a signal combining unit 135, a band-pass filter (BPF) 136, an amplitude emphasizing unit 137, a G interpolation/outline processing unit 130, an outline signal extracting unit 139, and the like.

The first adding unit 131 generates a first addition signal S based on the signals (R signal, G signal and B signal) which are input in parallel from the line memory 12. Then, the mean ratio calculating unit 132 calculates a mean ratio coefficient of each of the R signal, the G signal and the B signal and the first addition signal S based on color information of the surrounding pixels of the addition pixel. Then, the RGB generating unit 133 generates new signals of Rs, Gs and Bs from the mean ratio coefficient and the first addition signal S as signals of the same positions of the pixel array. The signals of Rs, Gs and Bs can be generated as a Beyer array. These processes replace the processes in a conventional color separation interpolating circuit and suppress color drift and color noise at an edge portion.

The signals of Rs, Gs and Bs processed by the RGB generating unit 133 are input to the signal processing circuit 14 as the subsequent stage, and processed by the white balance, the outline emphasizing, the gamma ($\gamma$) correction, the RGB matrix circuit, and the like. Then, the processed signals are output as digital signals DOUT0 through DOUT7 in the YUV signal format or RGB signal format. Further, in addition to the above-mentioned sensor unit 11 and line memory 12, the operation of the color correlation RGB generating circuit 13 and the signal processing circuit 14 is also performed based on the clock signal output from the system timing generating circuit (SG) 15. At this time, parameters and the like of the process of each circuit can also be controlled by commands. For example, externally input data DATA is input to the command decoder 16 via the serial interface (the serial I/F) 17, and then, the decoded signal is input to the system timing generating circuit 15, the line memory 12, the color correlation RGB generating circuit 13, and the signal processing circuit 14, so that the parameters and the like of the process can be controlled by the externally input data DATA.

Here, the first adding unit 131 adds signals of 4 pixels or more (here, 9 pixels of 3×3 pixel array) which are input in parallel from the line memory 12 to generate the first addition signal S. Since the addition signal S does not include a high frequency component which corresponds to the pixel pitch, the edge signal becomes gradual. Then, by detecting the case that signal change at the inclination part of the first addition signal S is more gradual than a predetermined criterion, a defocus correcting process which sharpens the signal change is performed by the defocus correcting circuit 140. Further, in parallel with the adding process by the first adding unit 131, the G interpolation/outline processing unit 130 performs a G interpolation process and an outline process to a signal before addition. Then, the S outline signal extracting unit 139 extracts a S outline signal (high resolution signal) which is a high frequency component from the signal subjected to the above-mentioned G interpolation process. Then, at a signal combining unit 135, the S outline signal is added to or multiplexed by the first addition signal S from the adding unit 131 to generate a combined signal Sa.

Further, it is preferred to extract the midrange frequency by the band-pass filter (BPF) 136 from the first addition signal S which is from the defocus correcting portion 140, to emphasize amplitude at the amplitude emphasizing unit 137, and then, to add or multiply it to or by the first addition signal S at the signal combining unit 135. With this procedure, the modulation degree of the midrange frequency MTF of the first addition signal S is improved, and the resolution feeling can be improved.

At the time of the calculation of the mean ratio coefficient in the circuit 132, there is a possibility that the color reproducibility deteriorates due to an error of the ratio coefficient at the edge when the signal changes. As a solution to the deterioration, the ratio coefficient of the signal input from the line memory 12 is calculated as being separated into High (Hi) level, Middle (Mid) level, and Low (Lo) level. Then, new R signal, G signal, and B signal are generated after selecting either the Hi-level or Lo-level of the ratio coefficient by the edge processing unit 134. The selection of the ratio coefficient is switched over based on the S outline signal from the circuit 139 and the signal extracted by the defocus correcting process from the circuit 140.

According to the first embodiment, even when random noise which is caused by a single pixel exists at the signal of each pixel, the random noise is reduced in the first addition signal S by generating the first addition signal S for the 3×3 pixel array at the circuit 131. Therefore, S/N can be improved. Further, by generating the signals of Rs, Gs and Bs from the common first addition signal S as the signal at the same position as each pixel, the random noise components of the signals of Rs, Gs and Bs become same. Accordingly, a false color suppressing circuit with demosaicing becomes unnecessary, and a false color caused by the edge can be suppressed. Namely, color noise of a single color can be suppressed since only luminance noise occurs.

Since the signals of Rs, Gs, Bs are generated from one addition signal S, the random noise which is included in each signal has the same phase and the noise does not increase even when new RGB signals are generated by performing subtracting process to a signal with color matrix arithmetic in the signal processing circuit 14 in order to improve the color reproducibility.

Furthermore, the midrange frequency component is extracted from the first addition signal S and the signal with an amplitude emphasized by the amplitude emphasizing unit 137 is added to the first addition signal S, whereby the resolution feeling can be improved.

FIG. 2B shows an example of the operation of the G interpolation processing circuit 130 which performs the above-mentioned interpolation process of the G signal in the color correlation RGB generating circuit 13 in FIG. 1. Here, the G signal is generated respectively at the pixel positions of R and B. In the following, FIG. 2B shows a method to generate a G signal gm for interpolation at the position of R3 pixel (the target of interpolation) which is the center position of the 3×3 pixel array shown in FIG. 2A. First, the maximum value (Gmax) and the minimum value (Gmin) of the signal level of the four G pixels (pixels of G1, G2, G4, and G5) which are adjacent to the R3 pixel are determined. In step S1, a signal of the difference Gd (=Gmax−Gmin) is calculated. In step S2, the difference signal Gd is compared with a predetermined determination level LevN. When Gd is determined to be smaller than LevN, a mean value of the four G signals (=(G1+G2+G4+G5)/4) is generated as the G signal gm in step S5. The determination level LevN corresponds to the random noise level. When the difference signal Gd is determined to be larger than LevN, an absolute value ABS(G1−G5) of the difference signal between the two signals of the G1 pixel and G5 pixel which are adjacent to the R3 pixel in the vertical direction is compared with LevN in the next step S3. When ABS(G1-G5) is determined to be smaller than LevN, a mean value of the signals of the G1 pixel and G5 pixel (=(G1+G5)/2) is generated and the interpolation is performed in step S6. On the contrary, when ABS(G1−G) is determined to be larger than LevN, an absolute value ABS(G2−G4) of the difference signal between two signals of the G2 pixel and G4 pixel which are adjacent to the R3 pixel in the horizontal direction is determined whether or not it is smaller than LevN in the next step S4. When the absolute value ABS(G2−G4) is determined to be smaller than LevN, the mean value of the G2 signal and G4 signal (=(G2+G4)/2) is generated and the interpolation is performed in step S7. In the case that there is no correlation in the vertical direction and the horizontal direction of the R3 pixel, the absolute values of the difference signals between the signal of the R3 pixel and the signals of R1, R2, R4, R5 pixels which surround R3 pixel, ABS(R1−R3)=R13, ABS (R2−R3)=R23, ABS(R4−R3)=R43, ABS(R5−R3)=R53, are calculated in step S8. In step S9, the pixel position (the minimum pixel position) where the difference signal is the minimum Rmin is determined from the calculation results of the absolute values (R13, R23, R43, R53) of the four difference signals. Then, the signal of the pixel which is in the same direction as the minimum pixel position is utilized as the G signal gm. For example, when the difference value between the signal of the R3 pixel and the signal of the R2 pixel is the smallest among R1, R2, R4, and R5 pixels which surround the R3 pixel, the signal of the G2 pixel which positions at the midpoint of the R2 pixel and R3 pixel is utilized for the interpolation. With these processes, the G signal gm of the high resolution can be interpolated.

In addition, in the case that all of the four absolute values (R13, R23, R43, R53) of the difference signals are smaller than LevN, the S/N can be improved by interpolating with the mean value of the four G signals (=(G1+G2+G4+G5)/4). This method of G interpolation process can also be applied to other cases than the above example.

Here, the G interpolation processing circuit 130 may be a computer which executes programmed software to perform the operation shown in the flowchart shown in FIG. 2B, or can be configured by combining independent circuits assembled to perform the operation of each step shown in FIG. 2B. Further, each block circuit in the color correlation RGB generating circuit 13, the operating method of which will be described below, can be realized by a computer utilizing software configured to perform the method, or by a circuit configured with combination of discrete circuits.

FIG. 3 shows an example of a method for generating a G outline signal performed in the color correlation RGB generating circuit 13 in FIG. 1. The G outline signal is generated by utilizing the G signal generated for the interpolation by the method shown in FIG. 2B. For example, in the case of G33 pixel at the center position of a 3×3 pixel array P32 surrounded by a thick line in a 5×5 pixel array P31 shown in FIG. 3, a signal G33' is generated as the G outline signal by multiplying the signal level of G33 pixel by eight, and multiplying each signal level of G22, g23, G24, g32, g34, G42, g43 and G44 by −1 and then adding them each. The G outline signal G33' does not occur, namely zero, with a uniform object, but occurs when a pattern of vertical stripes, horizontal stripes or other strips is generated on the surface of the object being imaged. Another method of generating an outline is to eliminate a high frequency signal from the G signal by a low frequency range pass filter (LPF), and to perform division with the G signal which includes the original high frequency. With this process, the result becomes 1 at the low frequency range whose frequency is lower than LPF. The high frequency signal whose frequency is higher than LPF becomes larger than 1 or smaller than 1. Therefore, when the result obtained by division is not 1, the signal is a high frequency signal, and this signal can be extracted as the outline signal. The extracted signal is amplitude-adjusted to the optimal outline signal level and multiplied by the original signal, thereby to generate the combined signal with the emphasized outline. Further, another method can be adapted as the method for generating the outline signal.

Figure 4:
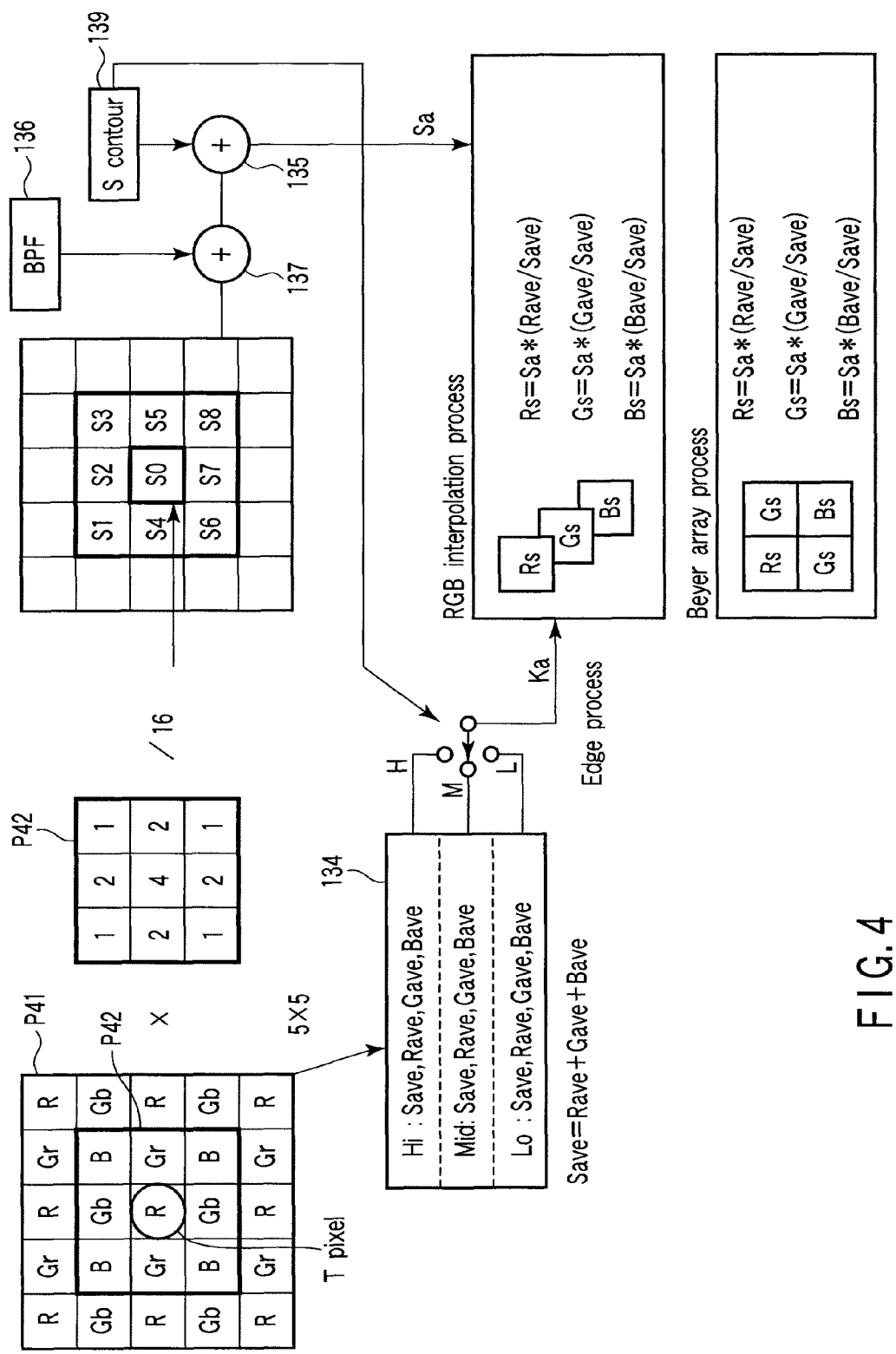
FIG. 4 is a diagram showing an example of a basic processing method and a processing method performed for an edge area of an object in the color correlation RGB generating circuit in FIG. 1.
Figure 5:
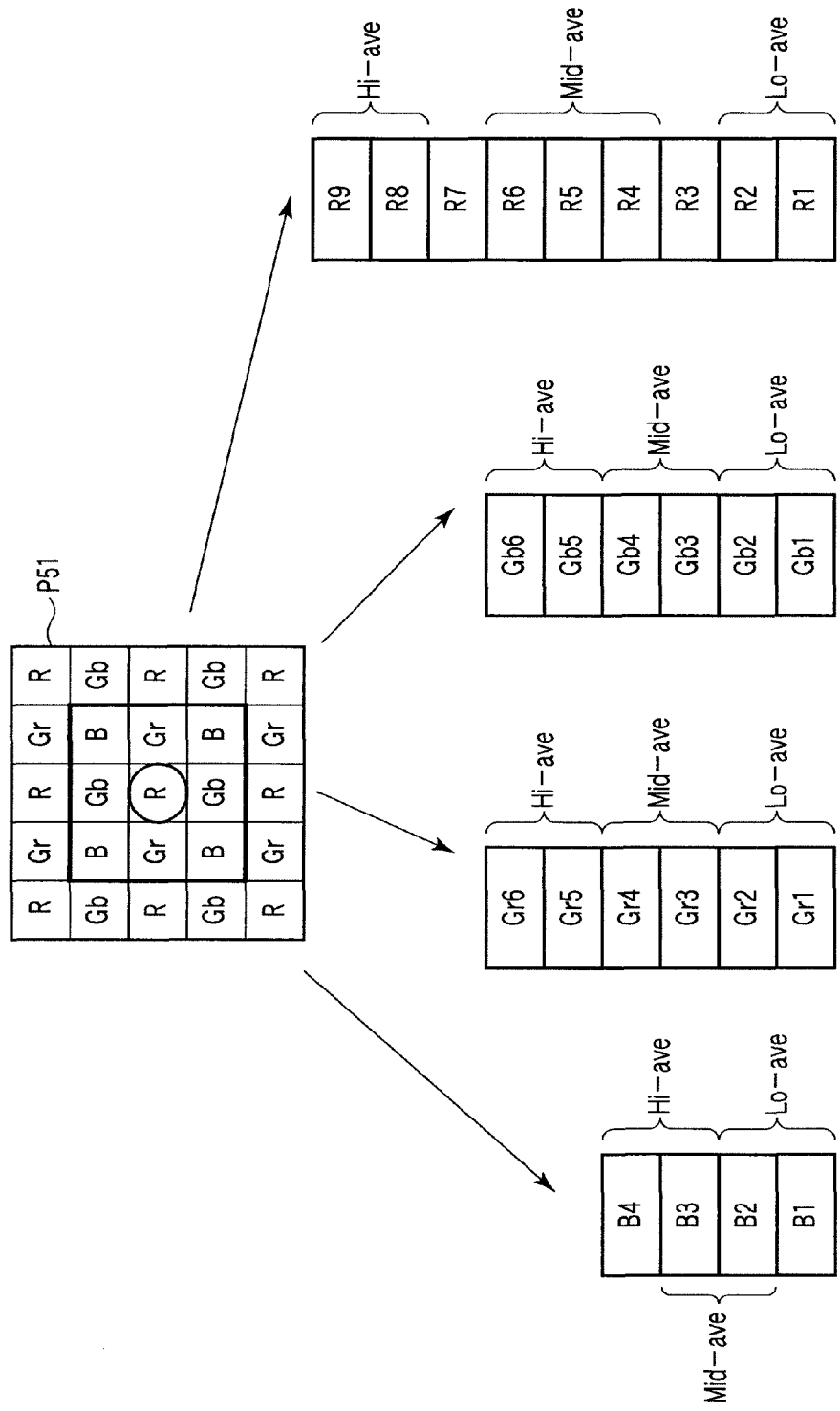
FIG. 5 is a diagram showing a part of the processing method of FIG. 4 in detail.

FIGS. 4 and 5 show an example of a basic processing method performed in the color correlation RGB generating circuit 13 in FIG. 1 and a processing method performed for an edge area of an object, that is, an area at which the signal obtained from the object sharply changes.

First, filter arithmetic of a 3×3 pixel array P42 is performed taking the center pixel (T pixel) of 5×5 pixel array or 7×7 pixel array (here, T pixel is the center pixel in a 5×5 pixel array P41) as the center. In this case, as shown in figures, the signal of T pixel of the 3×3 pixel array P42 is multiplied by 4, the signals which are adjacent to the T pixel in the vertical direction and horizontal direction are multiplied by 2, the signals on the corners of the 3×3 pixel array is multiplied by 1, and then, the signal level which is the sum is divided by 16. The signal obtained in this manner is defined as an addition signal S0 of T pixel. Then, a Sa signal is generated by the combining unit 135 combining the addition signal S0 with the signal from the BPF 136 and the signal from the S outline circuit.

On the other hand, the mean value Save of the addition signals S1 through S8 is generated, and the mean values of the pixel signals of the same color among the signals in 5×5 pixel array or 7×7 pixel array (here, 5×5 array) of a RGB Beyer array are respectively calculated as Rave, Gave and Bave. The signal Save is the added signal of Rave, Gave and Bave in Hi, Mid and Lo. Then, the signal of the edge portion (the edge signal) of the object image is detected by the edge processing unit 134, and the edge process is performed to the edge portion. At the time of the edge process, the mean value of all signals of the same color in 5×5 pixel array or 7×7 pixel array (here, 5×5 pixel array) is not simply used as the ratio coefficient. The ratio coefficients of the R signal, the G signal and the B signal are calculated while being separated into a large level, a middle level and a small level. The ratio coefficient calculated in correspondence to the signal of large level or small level is utilized in the edge area of the signal, and the ratio coefficient calculated in correspondence to the signal of middle level is utilized in the flat area of the signal.

When the ratio coefficients of the R signal, the G signal, and the B signal are calculated while being parted into large level, middle level and small level as mentioned above, the sorting process is performed for ratio coefficients for the R signal, the G signal and the B signal. For example, as shown in FIG. 5, each signal of each RGB pixel in a 5×5 pixel array P51 is sorted in increasing order of value in accordance with the level. For example, pixels B are sorted in the order from the minimum level pixel B1 to the maximum level pixel B4. Then, the mean values Rave, Gave and Bave of two pixels in Hi-level of R, G and B are respectively calculated. Here, it is also possible to calculate the mean value of three pixels. In the same manner, the mean values Rave, Gave and Bave are calculated of two or three pixels in Mid-level of R, G and B. Here, a three-pixel mean value is calculated at Mid-level of the pixel R, and a two-pixel mean value is calculated at the others. In the same manner, the mean values Rave, Gave and Bave are calculated of two or three pixels in Lo-level of R, G and B. Then, as shown in FIG. 4, the mean value of the addition signals Save is calculated by adding the mean values (Save=Rave+Gave+Bave) respectively in Hi-level, Mid-level and Lo-level. Here, the number of pixels which are the target of the process at the edge area is not limited to two or three.

Then, three ratio coefficients Ka (=Rave/Save, Gave/Save and Bave/Save) are calculated in correspondence to the second addition signal Sa based on the mean values Rave, Gave, Bave, and the added mean value Save of the three. Then, new signals Rs (=Sa*Rave/Save), Gs (=Sa*Gave/Save) and Bs (=Sa*Bave/Save) are generated utilizing the signals Ka and Sa by the RGB generating unit 133. At this time, when the S outline signal is Hi (plus), the signals of Rs, Gs and Bs are newly generated utilizing the ratio coefficient of Hi-level. When the S outline signal is Lo (minus), the signals of Rs, Gs and Bs are newly generated utilizing the ratio coefficient of Lo-level. In this manner, when the signals of Rs, Gs and Bs are generated and processed by calculating Hi or Lo of the S outline signal, it is possible to suppress the occurrence of a false color signal at the edge area even when the positions where the maximum resolution of R, G and B is obtained are displaced by chromatic aberration.

FIGS. 6A to 6H show an example of a process for performing defocus correction of the first addition signal S, performed by the defocus correcting circuit 140 in the color correlation RGB generating circuit 13 in FIG. 1. FIG. 6A shows a signal image which is expressed by the pixel in the sensor unit 11, and the diagonally shaded part indicates the area where the signal wave gradually slants due to the adding process. As the G-G' signal wave which corresponds to the pixel line along with G-G' line in FIG. 6A, the signal level gradually increases from the left side of the figure (G side) to the right side of the figure (G' side). Here, as shown in FIG. 6B, giving attention to the pixel at the center area in a 3×3 pixel array P61, the pixel signal of the center position (5,E) of a 10×10 pixel array P62 is D0, and the adjacent pixel signals in four slanting directions are D1 to D4. Then, inclination is determined for D1 to D4 under the determination conditions shown in FIG. 6C. Namely, when the difference with D0 is smaller than a predetermined determination level LevN, it is determined that there is no inclination and 0 (zero) is set in a 7×7 pixel array P63 as shown in FIG. 6D. When it is determined that there is inclination, 1 is set. Based on the result of such inclination determination, it is determined whether or not 0 exists in the 3×3 pixel array area which is at the center part in the 7×7 pixel array P63. In the case that 0 does not exist, the determining area is expanded to a 5×5 pixel array. The maximum area can be set freely. When 0 exists in the 5×5 pixel array, the signal at the position where 0 exists is replaced. When 0 exists at a plurality of pixels, the replacement is performed by averaging process or median process. When 0 signals are included to a large pixel array and a small pixel array, the array which has a larger number of 0 signals is selected. By sequentially selecting the process, the signal a gradual inclination of which is improved is obtained, as shown in FIG. 6E. When there is no 0 in the 5×5 pixel array area in FIG. 6D, the inclination is determined to be the original gradual inclination of the object itself not the generated inclination by the adding process and the signal is utilized without being replaced.

FIG. 6F shows an example of a Hi-Lo determining method for the ratio coefficient. With the comparison of the signal D(1) which is the determined result as 1 in FIG. 6D and the signal D(0) which peripheral determining result is 0, the determination in value amount is performed. It is determined as +1 when D(0) is larger and as −1 when D(0) is smaller. As a result, the ratio coefficient of G-G' becomes as shown in FIG. 6G. For example, as the G-G' signal wave shown in FIG. 6H, the coefficients used for Mid, Lo, Hi, Mid, . . . are determined in accordance with the determined results of 0, −1, +1, 0, . . . .

FIGS. 7A to 7J show the flow of the signal process at each unit of the CMOS image sensor shown in FIG. 1. Here, to make the principle of the signal processing easy to understand, the signals of R, G and B which are output from the sensor unit 11 are shown with one line extracted so as to be output at the same phase. The signal S with an improved S/N is obtained by performing the filtering process to the signal with weights of 1, 2, 1 in the horizontal direction. However, since the signal changing at the edge portion of the signal S is gradual, the modulation degree at the critical resolution area becomes zero, so that the signal changing can not be detected. Therefore, the G outline signal generated as mentioned above with reference to FIGS. 2A, 2B and 3 is utilized as the S outline signal. Then, by adding the S outline signal to the signal S, the signal Sa having the same high resolution as the original G signal is obtained. At this time, it is also possible to adjust the signal level of the S outline signal in accordance with the resolution feeling. The outline emphasis effect can be obtained by adding the S outline signal to the signal S while enlarging the level of the S outline signal.

Further, as mentioned above, the signal phase of the RGB signals which are output from the sensor unit 11 is shifted due to the chromatic aberration by the lens 18. The S outline signal utilizes the G outline signal described above. Here, a small outline signal level is determined to be noise and eliminated from the S outline signal, and only a large signal is utilized for the S outline signal. Further, the outline level is adjusted and added to the signal S. The added signal S is the sum of adding by each RGB signal. Therefore, as shown in FIG. 7E, the inclination of the signal at the signal changing part is gradual in the low frequency range, and the change level of the signal (the modulation degree) becomes small in the high frequency range. The signal Sb shown in FIG. 7F obtained by performing the defocus correction to the signal S improves the edge defocusing at the low frequency range. Since the inclination is not gradual at the high frequency range, the signal S is output as it is. The signal Sa shown in FIG. 7G obtained by adding the S outline signal to the signal Sb is emphasized at the edge portion of the signal to improve the resolution feeling.

As shown in FIGS. 6A to 6H, the combined signal of the generated signal with the polarity obtained from the S outline signal is a ratio coefficient selection signal. The ratio coefficient Ka of the signal wave of Hi, Mid and Lo is determined based on this signal.

Here, an example of the method for selecting the ratio coefficient at the edge area will be described. When the S outline signal level shown in FIG. 7D is plus or minus, it is determined that the part is an edge part. When the S outline signal level is zero, it is determined that the part is not an edge part. Based on the determination, the edge processing circuit 134 shown in FIG. 4 selects, among the ratio coefficients, the ratio coefficient of the mean value of Hi-level (Hi-ave) when the S outline signal is plus, selects the ratio coefficient of the mean value of Lo-level (Lo-ave) when the S outline signal is minus, and selects the ratio coefficient of the mean value of Mid-level (Mid-ave) when the S outline signal is zero. When the S outline signal is smaller than a predetermined level, it is determined as no signal (zero). When the S outline signal is larger than the predetermined level, it is determined that the outline signal exists and the signal of plus or minus becomes effective. Here, as a different method from the above, it is also possible to perform interpolation process to the ratio coefficient calculated in FIG. 2 with the adjacent ratio coefficient when the edge signal is determined at the edge area in low range.

Next, the signals of Rs, Gs and Bs are generated from the signal Sa and the three coefficients Ka. As a result, resolution information which is almost the same as that of the original G signal is generated. Further, as clearly seen in FIGS. 7C and 7J, a false color signal does not occur because the edge of the signals of Bs and Rs has the same phase as the signal Gs. Further, random noise of the signals of Rs, Gs and Bs is in correlation with the signals of R, G and B, (the same phase). Namely, both signals of R and G also become large when G signal level becomes large in random noise, and both signals of R and G become small when the G signal level becomes small in random noise. Therefore, the color noise (dot-shaped random noise) which conventionally occurs can be suppressed, and only luminance noise exists as noise.

Figures 8A, 8B:
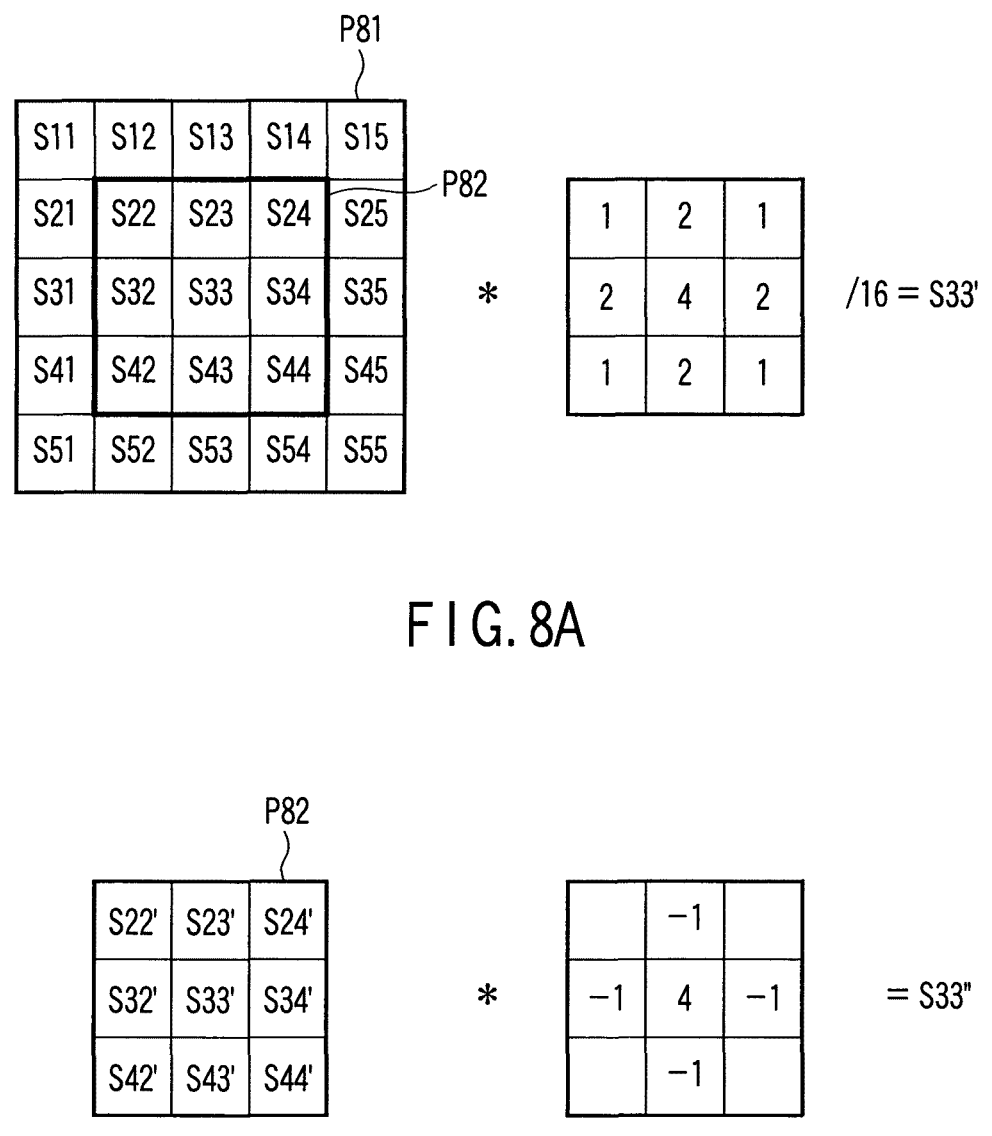

FIGS. 8A and 8B show an example of a method for enlarging (emphasizing) signal amplitude of the middle frequency range (Midrange) of the first addition signal S, performed by the color correlation RGB generating circuit 13 in FIG. 1. FIG. 8A shows a method for extracting a midrange signal from the first addition signal S by utilizing BPF process. For example, the signal S33 of the center pixel of a 3×3 pixel area P82 in a 5×5 pixel array P81 is multiplied by the coefficient (4, 2 and 1) which corresponds to each pixel of the 3×3 pixel area P82 and then added. Then, the signal is divided by 16 after the addition so that the signal level stays the same before and after the addition, and this emphasized signal newly becomes the signal S33' of the center pixel.

FIG. 8B shows a method for generating the emphasized signal as performing the same process as mentioned above for each pixel in the 3×3 pixel area P82. The outline extracting process as same as mentioned above with reference to FIG. 3 is performed to the generated signal to extract an emphasized signal S33" of midrange. The signal S33" is added to or subtracted from the original first addition signal S while controlling the amplitude by the amplitude emphasizing unit 137 in FIG. 1. With this process, the amplitude at the midrange frequency is increased and the resolution feeling is improved. Although the amplitude emphasis is performed as mentioned above, the color reproducibility does not vary because the color balance is separately performed by the mean ratio calculation in this embodiment.

<Second Embodiment>

FIG. 9 is a block diagram showing a general configuration of a CMOS image sensor according to a second embodiment. As mentioned above, the input signal obtained from a defocused image by the lens 18 is not a high resolution signal. Therefore, with the CMOS image sensor according to the second embodiment, a solution for the defocusing of the lens 18 is taken. A color correlation RGB generating circuit 13a which partly differs from the color correlation RGB generating circuit 13 according to the first embodiment is utilized.

In the following, the different parts are mainly described. In the color correlation RGB generating circuit 13a, the correcting circuit 140 performs defocus correcting process to the first addition signal from the addition circuit 131 to obtain a signal Sb. The obtained signal Sb is introduced to the S outline circuit 139 selected by the switch element 141. A Sa outline signal is generated by utilizing the signal Sb. An outline signal which has a high S/N is generated by use of the signal Sb from the correcting circuit 140. Needless to say, as mentioned in the first embodiment, a signal which is formed by selecting the G signal from the interpolation processing circuit 130 with the switch element 141 and by giving the G signal to the S outline circuit 139 can be utilized. Further, the combined signal of the outline signal from the signal Sb and the outline signal from the G signal can be utilized as the S outline signal. Overlapped description is omitted for the other circuits which are the same as those shown in FIG. 1.

According to the second embodiment shown in FIG. 9, similar effects as the first embodiment can be obtained. Further, the depth of field can artificially be deepened by the signal processing even in the case of using a lens 18a whose focal length of each RGB is different as described later with reference to FIGS. 11A and 11B.

<Third Embodiment>

Figure 10:
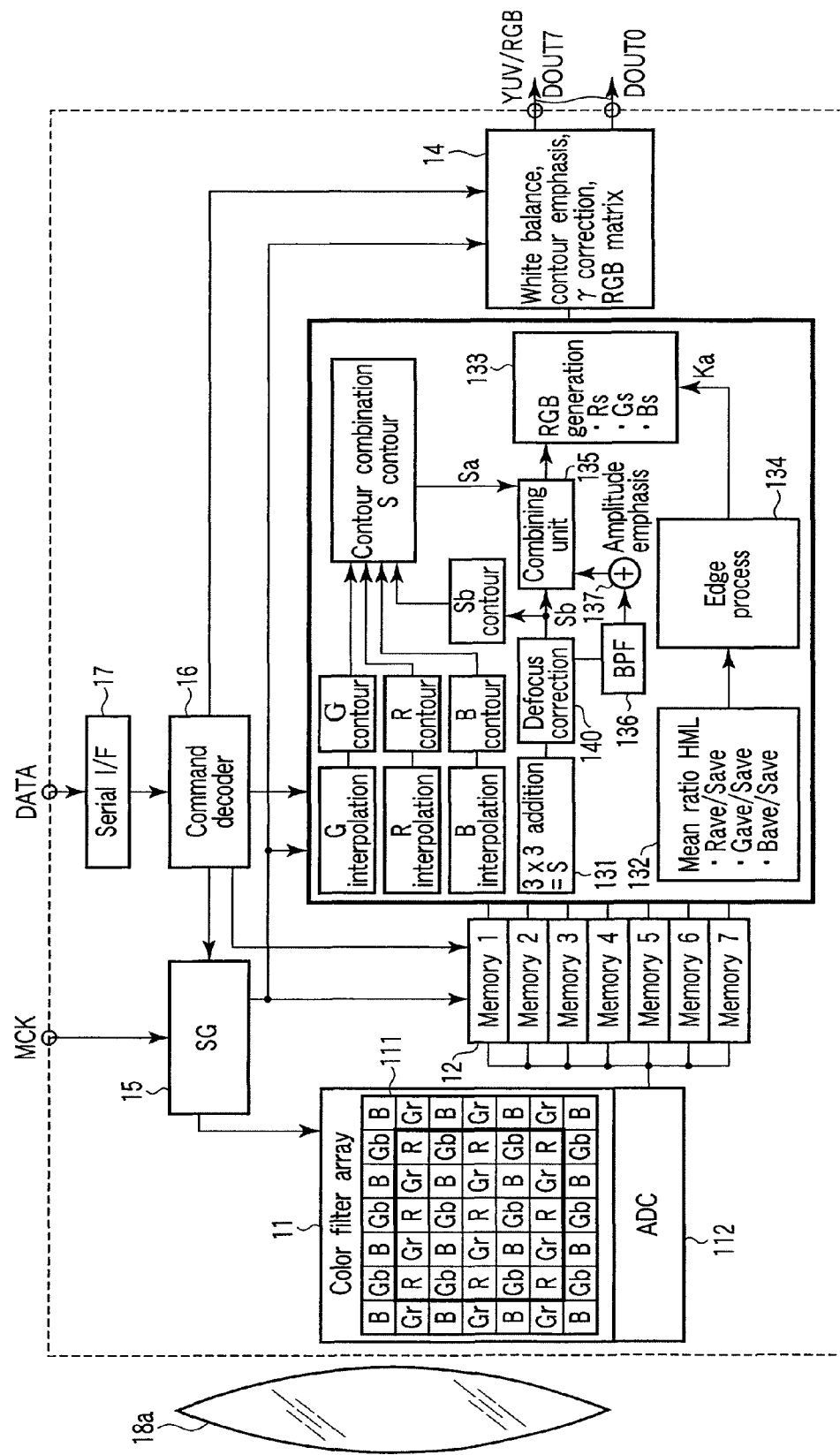
FIG. 10 is a block diagram showing a general configuration of a CMOS image sensor according to a third embodiment of the present invention.
Figure 11A:
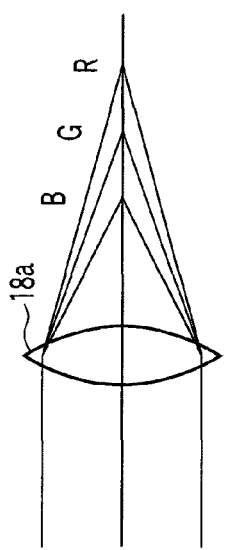
FIG. 11A is a diagram showing chromatic aberration on the axis and a focusing position of each color signal which occur with a lens in FIG. 10.
Figure 11B:
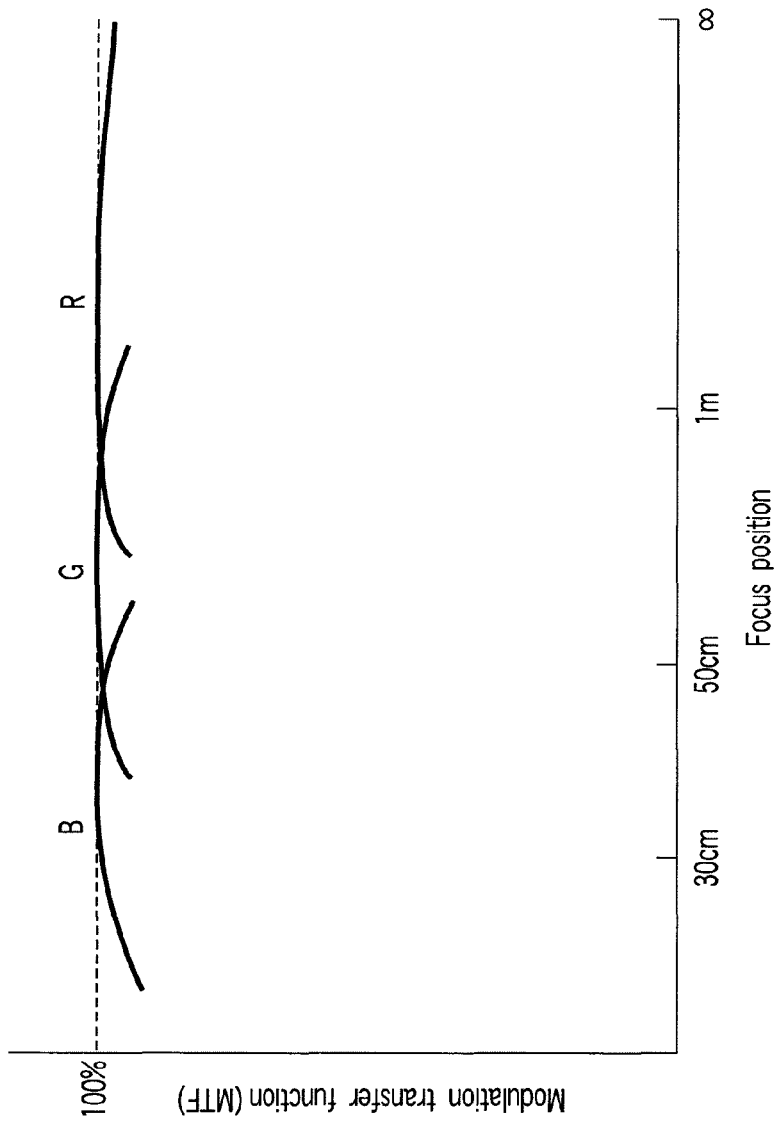
FIG. 11B is a diagram showing the relation between the modulation degree and the focusing position of each color signal in order to obtain a desired depth of field with the lens shown in FIG. 11A.

FIG. 10 is a block diagram showing a general configuration of a CMOS image sensor according to a third embodiment. With the CMOS sensor, regarding the S outline, an outline signal Sb generated from a Sb signal is combined with a R outline signal, a G outline signal and a B outline signal which are generated from RGB signals, the combined signal thus obtained is utilized as a S outline combined signal. The lens 18a has chromatic aberration on the axis (see FIG. 11A) which is caused by the lens design, and the chromatic aberration on the axis is positively utilized. Namely, as shown in FIG. 11B, the lens 18a is designed to have the depth of field so that the focus position of a B component of light input is around 30 cm, the focus position of a G component is from 50 cm to 1 m, and the focus position of a R component is equal to or longer than 1 m. In this manner, by drifting the focus position of each BGR of a luminous signal, the depth of field is made to be different.

Figure 12:
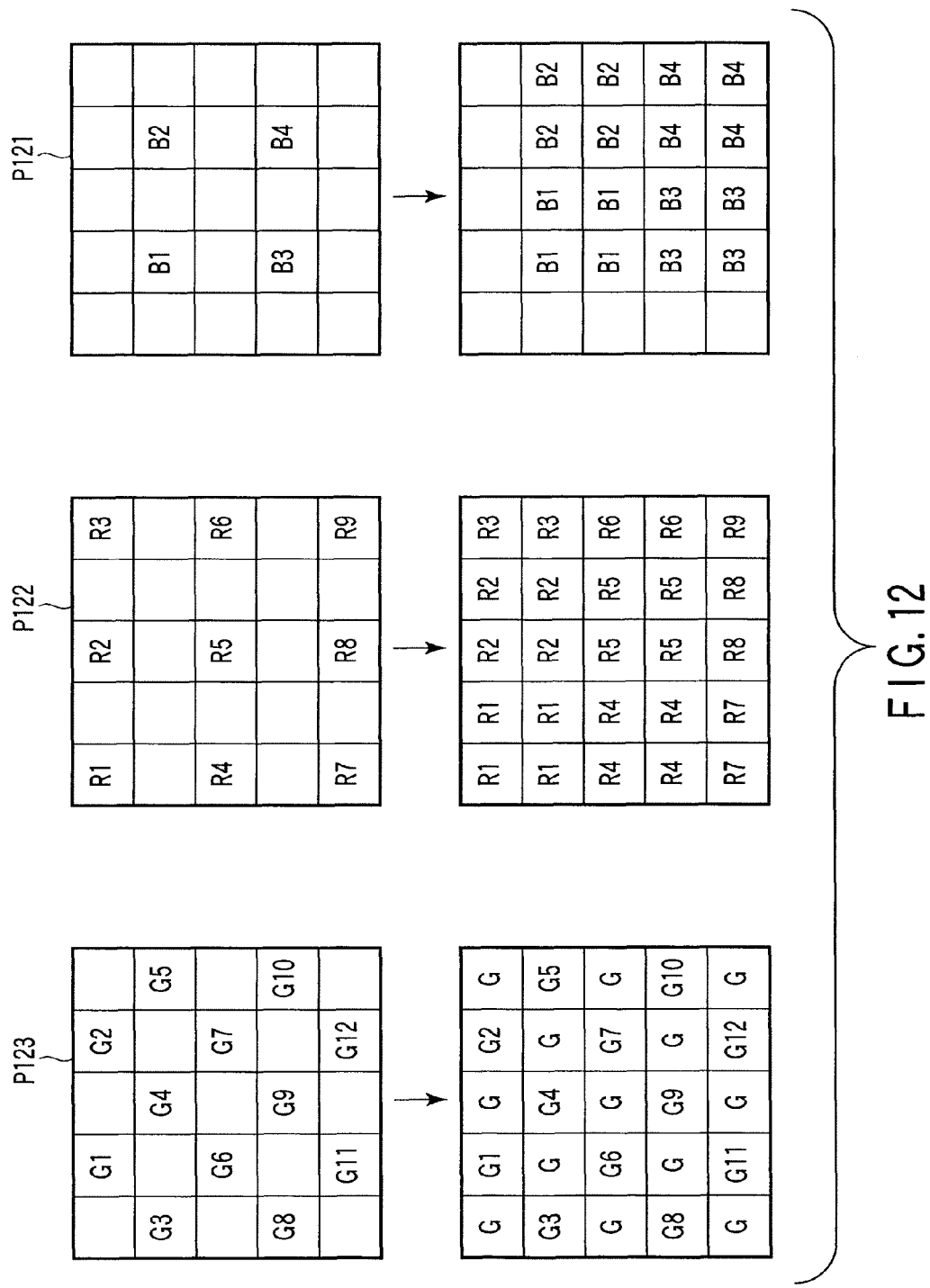
FIG. 12 is a diagram showing an example of a method for generating a G outline signal in a color correlation RGB generating circuit in FIG. 10.

The CMOS image sensor first performs, as shown in FIG. 12, an interpolating process, which is a process to fill a center pixel with a mean value of four adjacent pixels in the vertical and horizontal directions, of 3×3 pixel array of 5×5 pixel array P121, P122, P123 of each RGB signal. An outline signal of each RGB signal is extracted from the interpolated signal of each pixel by a similar process as in FIG. 2 or 3. The extracted signal is added to obtain a signal which has resolution feeling for a close object to a far object.

According to the third embodiment, the similar effects as the first embodiment can be obtained. Further, even when the ordinary lens 18a which has chromatic aberration on the axis as shown in FIGS. 11A and 11B is utilized, the depth of field can be set deeply by the signal processing.

<Fourth Embodiment>

FIG. 13 is a block diagram showing a general configuration of a CMOS image sensor according to a fourth embodiment. Comparing the fourth embodiment with the third embodiment, the same lens 18a is adapted, but a part of the sensor unit 11b and a part of the color correlation RGB generating circuit 13b are different.

In the following, the different parts are mainly described. A color filter array of the sensor unit 11b adapts a primary-color filter 111 taking 4×4 array of WRGB filter as a basis, and a W filter is a color filter through which RGB signals pass. With this configuration, the sensor unit 11b separates the luminous signal condensed by the lens 18a into W, R, G and B signals. The signals are converted into signal charge by the two-dimensional photodiode array and converted into digital signals by the ADC 112 before being output.

Here, as shown in FIG. 13, the W filters are arranged as a checkers-pattern so as to be an array surrounding each RGB filter in the vertical and horizontal directions with the W filters. With this arrangement, at the color correlation RGB generating circuit 13b, an addition signal S which has the same numbers of WRGB pixels with any combination in the 4×4 pixel array of the filter 111 is obtained. Further, an interpolating circuit 130W performs an interpolating process of the W signal and an outline circuit 139W performs an outline extraction of the W signal, so that a S outline signal is obtained by a combining circuit 139S. With this structure, the outline signal is extracted from the B signal for a close object and from the R signal for a far object as outline information of the W signal in accordance with the object positions.

According to the fourth embodiment, the similar effects as the first embodiment can be obtained. In addition, since the amount of the S signal increases by utilizing the W pixel, image sensitivity improves.

<Different Embodiments>

The above-mentioned embodiments are respectively described by taking the 5×5 pixel array and 7×7 pixel array as an example. A higher S/N and higher image quality can be obtained by increasing the number of pixels.

Further, by widely extracting the outline signal (width of a plurality of pixels) or by utilizing an outline signal obtained by combining a signal of wide width of a plurality of pixels with a signal of narrow width of one pixel, for example, an equivalent defocus correcting effect can be obtained without utilizing a defocus correcting circuit.

Here, in order to improve the color reproducibility of RGB, a RGB matrix circuit, which is one of the factors for deterioration of the S/N of a color camera, performs RGB matrix arithmetic with the following arithmetic equation, for example.

$$\begin{pmatrix} R \\ G \\ B \end{pmatrix} = \begin{pmatrix} 1.83 & -0.80 & -0.03 \\ -0.68 & 2.48 & -0.80 \\ -0.33 & -0.80 & 2.13 \end{pmatrix} * \begin{pmatrix} Rs \\ Gs \\ Bs \end{pmatrix}$$

This process performs for one color to subtract the other two colors. Namely, by subtracting the amount of the other two colors which are mixed to the color, the purity of the one color is raised to improve the color reproducibility. The factors for the color mixing are factors of spectral characteristics of the color filter itself, optical cross-talk toward the photodiode of the sensor, signal diffusion in a silicon substrate of the sensor unit, and the like. Conventionally, with the subtracting process, the noise amount increases since the noise of the Rs, Gs and Bs signals is random.

On the contrary, according to the embodiment of the invention, since the components of the random noise of the Rs, Gs and Bs signals are the same, the above-mentioned subtracting process has the effect of decreasing the random noise. For example, when generating the R signal, the Gs and Bs signals also become large when the Rs signal becomes large due to the random noise. With the matrix arithmetic, the components of Gs and Bs are subtracted from the Rs signal as the R signal, and thus, a larger signal is subtracted as the random noise is larger. Therefore, the R signal is subtracted by a larger signal. On the contrary to the above description, when the Rs signal becomes small due to the random noise, the Gs and Bs signals also become small. Although the Gs and Bs components are subtracted from the Rs signal as the R signal with the matrix arithmetic, a smaller signal is subtracted as the random noise is smaller. Therefore, the signal reduction of the R signal is small. As a result, the R signal has an effect to make the random noise small. In the same manner, the random noise of the G and B signals is also reduced.

Further, even in the case that the image pickup device according to the invention is adapted to a CMOS image sensor which color filter array is different, the same effects as mentioned above can be obtained by newly generating Rs, Gs and Bs based on the generation of the similar addition signal S and the ratio calculation of RGB after generating RGB signals.

Further, the image pickup device according to the invention is not limited to CMOS image sensors. The image pickup device can be adapted to other CCD (charge coupling type) sensors and lamination type sensors and also to a dedicated image signal processor (ISP) which is formed as a separate chip from a sensor.

When the invention is adapted to the case that the sensor unit adds, for example, the amount of four pixels of a 10-bit ADC signal to generate the S signal, the degree of accuracy of the S signal may be improved to practical 12 bits with the adding process, and the practical saturated signal amount is quadrupled. Further, by the adding process of four pixels' amount, the random noise is reduced nearly to a half. Since the saturated signal amount is quadrupled and the random noise is reduced to a half in this manner, it becomes possible to magnify the dynamic range (the saturated signal amount/the random noise) by eight times. Furthermore, when the adding process of sixteen pixels' amount of 4×4 pixel array is performed, the saturated signal amount is magnified by sixteen times and the random noise is reduced to the quarter. Then, it becomes possible to magnify the dynamic range by sixty-four times. Therefore, even in the case that the saturated signal amount is decreased with fine pixels, the same S/N as the conventional one can be obtained even with a practically quarter amount of the saturated signal compared to the conventional amount since the saturated signal amount is quadrupled by adding the practical four pixels' amount.

For example, when the saturated signal amount is 10000 ele, shot noise (the square root of the saturated signal amount) is 100 ele, and S/N becomes 40 dB. When the saturated signal amount is 2500 ele, the shot noise is 50 ele and S/N becomes 34 dB. However, when the invention is adapted, the signal amount is quadrupled to be 10000 ele by adding the 4 pixels' amount, while the noise is only doubled to be 100 ele. As a result, S/N becomes to 40 dB. Therefore, even when the saturated signal amount becomes practically a quarter, high S/N can be expected.

Since the image pickup device according to the invention can avoid the deterioration of the image quality caused by chromatic aberration of the lens 18, 18a, it is possible to realize high sensitivity by making the F value of the lens 18, 18a small. Further, the height of a camera module can be lowered by making the height of the lens 18 low (thin?). As a result, a small-sized camera module compliant with a thin cellular phone can easily be realized.

The above-mentioned embodiments are described by taking a single plate color camera of a RGB type or a WRGB type as an example. Since chromatic aberration also occurs even with a three-plate color camera which obtains three primary-color RGB signals by use of a prism, high sensitivity and chromatic aberration solution can be obtained as the same principle as that of the embodiments. When the outline correction is performed by adapting the present invention to a monochrome sensor, the sensitivity can be increased to enlarge the dynamic range with increase in signal and decrease in noise.

Here, FIG. 14 shows a 4×4 pixel array P141 of the WRGB color filter 111 of the embodiment in FIG. 13. FIG. 15 shows a sectional view of the sensor unit 11 in a pixel line WGWG in the vertical direction, and FIG. 16 shows spectral characteristics of the WRGB pixel filter. In FIG. 15, a micro-lens 18b is arranged for each pixel instead of the lens 18a at the front face of the color filter 111. The light having passed through the filter 111 enters as focusing on the receiving surface of a photodiode PDW, PDG for each pixel formed at the surface area of a Si substrate 150 serving as a semiconductor substrate.

As shown in FIG. 16, since the W color filter is clear (white), the peak of the light intensity is higher than that of the other RGB filters and all components are included. Therefore, the signals of all of the range of RGB can be obtained from the diode PDW. However, because of the diffusion of signal charge which is obtained by photoelectric conversion in the Si substrate 150, color mixing occurs due to the mixing to pixels of other colors. In addition, the signal level is increased against the spectral characteristics of RGB without the W pixel. The color becomes light under the influence of the color mixing. Therefore, the color reproducibility is improved by increasing the color matrix coefficient. However, if the matrix coefficient is large, S/N is considerably deteriorated. Since the signals of other colors are subtracted from the own signal in general, the signal S becomes small and since the random noise does not become small, S/N is deteriorated. Further, the signal of the W pixel is obtained being about doubled to the signal of the G pixel. Therefore, when the sensitivity is set so that the W pixel is not saturated, the RGB signals become small to be half than conventionally, and there arises a problem that spectral shot noise is deteriorated by 3 dB. Here, it is possible to make the sensitivity small by shifting the clear W color filter to gray. As a result, a method for reducing color mixing from the W pixel is proposed. However, this method derives a problem that the advantage of high sensitivity utilizing the W pixel is lost.

<Fifth Embodiment>

Figure 19:
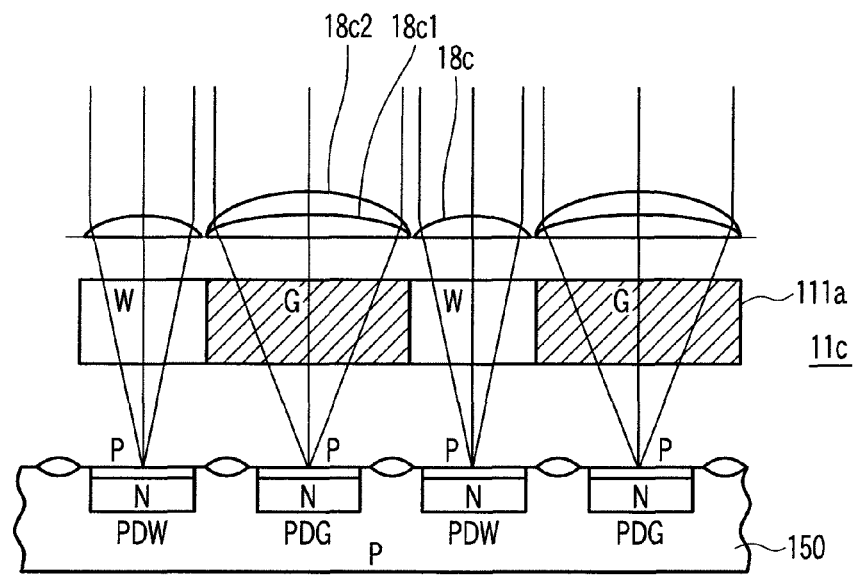
FIG. 19 is a sectional view of a pixel in FIG. 17.
Figure 20:
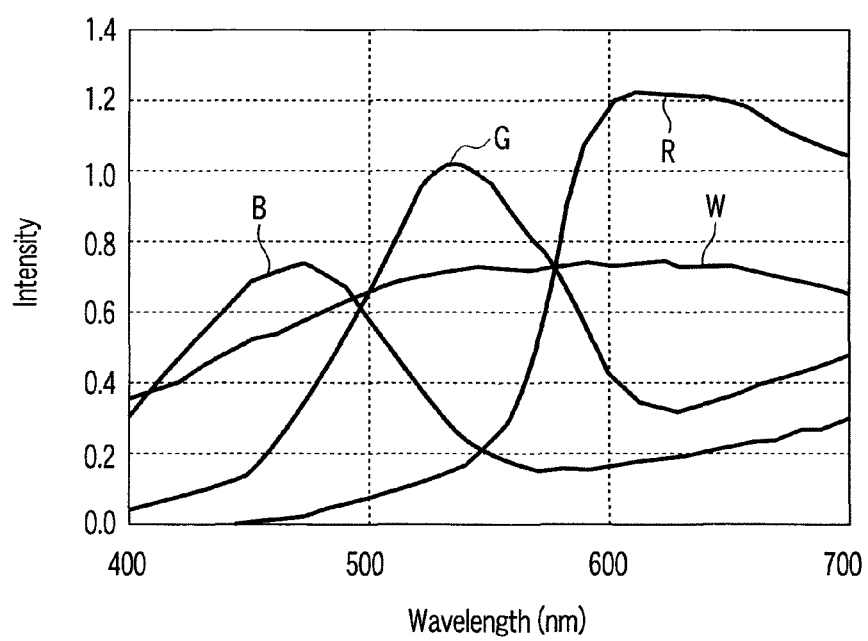
FIG. 20 is a diagram showing an example of spectral characteristics of a color filter shown in FIG. 19.

FIG. 17 shows a 4×4 pixel array P171 of a WRGB color filter according to a fifth embodiment which can solve the above-mentioned problem. With this pixel array, as shown in FIG. 18, the area of the W pixels arranged as a checker-pattern is made to be small, so that the areas of R, G and B pixels are relatively large. As shown in FIG. 18, the W pixels each has a width of 1.525 nm, and the R, G, B pixels each has a width of 1.975 nm, for example. FIG. 19 shows a sectional view of a sensor unit 11c which corresponds to the WGWG pixels arranged in the horizontal direction. The area of the receiving surface of PDW and PDG is the same for all the WRGB pixels. The size of the area may be optimized in accordance with the signal charge amount which is to be generated when assuming ordinal color temperature. As shown in FIG. 19, the area of a micro-lens 18c and that of a W color filter are set to be smaller than that of G in accordance with the RGB pixels shown in the plane view of FIG. 17. More specifically, the area of the W pixel having high sensitivity is set to be small, and the area of the G, R, or B having lower sensitivity than that of the W pixel is set to be large. By setting the areas different, the signal amounts of the W pixel and the G pixel are the same at the ordinal color temperature, for example, 5500K. By reducing the area through which light enters the W pixel to make the areas of the other pixels of R, G and B large, high sensitivity which is the advantage of the W pixel can be obtained. In this case, as shown in the figure, the micro-lens for the G pixel is formed as a two-layered structure including an inner lens 18c1 and an outer lens 18c2 which are manufactured through two manufacturing process steps, while the micro-lens 18c for the W pixel is formed by one step. Regarding the curvature of the micro-lens, curvature of the micro-lens 18c1 as well as the curvature of the lens 18c2 corresponding to the pixels of R, G and B whose area is large is set to be large, respectively, and that of the micro-lens 18c corresponding to the W pixel whose area is small is set to be small. Thus, in order to change the curvature of the micro-lenses, the micro-lens 18c is formed in one step for the W pixel, and two steps or more for each of the pixels of R, G and B whose area is large. FIG. 20 shows spectral characteristics and indicates that the signal level of the W pixel is reduced and that of the pixels of R, G and B is increased in correspondence thereto. Since the incident light amount of the W pixel is decreased, level lifting (color mixing) at the skirt part of the signals of R and G having a wavelength of 550 nm or more is decreased. This results in reduction of the color matrix coefficient for improving the color reproducibility, and deterioration of S/N is decreased.

As mentioned above, the clear or white filter utilized for high sensitivity has about doubled sensitivity to that of the G signal. Therefore, there have been problems that the signal balance is disrupted, and that S/N is deteriorated by increasing the color matrix coefficient for improving the color reproducibility against the increase of mixing color due to the leakage from the W pixel. However, according to the present embodiment, the area of the W pixel of high sensitivity is decreased and that of the other RGB pixels is increased in correspondence thereto. As such, the S/N of color signals can be improved, and the signal levels of the W pixel and the G pixel can be adjusted to be same. As a result, since the color matrix coefficient can be set to be small, deterioration of S/N can be avoided.

Namely, since color mixing which occurs in the Si substrate 150 can be decreased by making the W pixel small, S/N deterioration caused by the color matrix process can be decreased. Further, since the sensitivity is increased by enlarging the effective area of the other RGB pixels through which light enters, S/N can be improved.

Figure 21A:
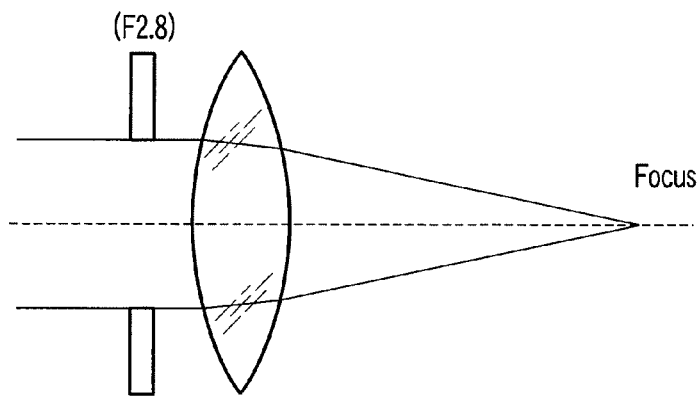
FIG. 21A is a diagram showing an example of a lens utilized for the embodiment of the invention.
Figure 21B:
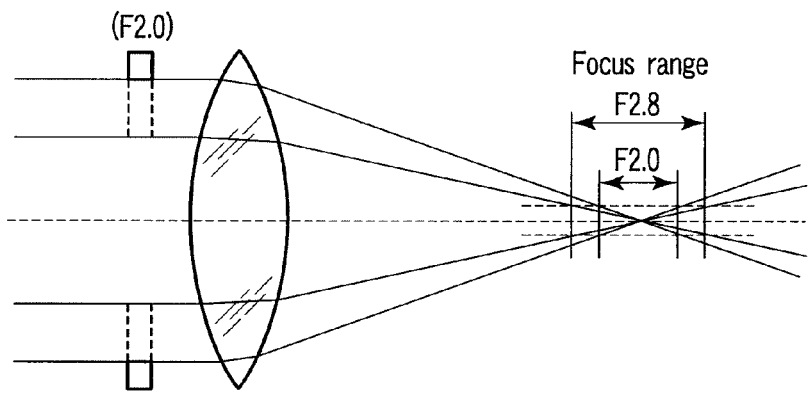
FIG. 21B is a diagram showing another example of the lens utilized for the embodiment of the invention.
Figure 21C:
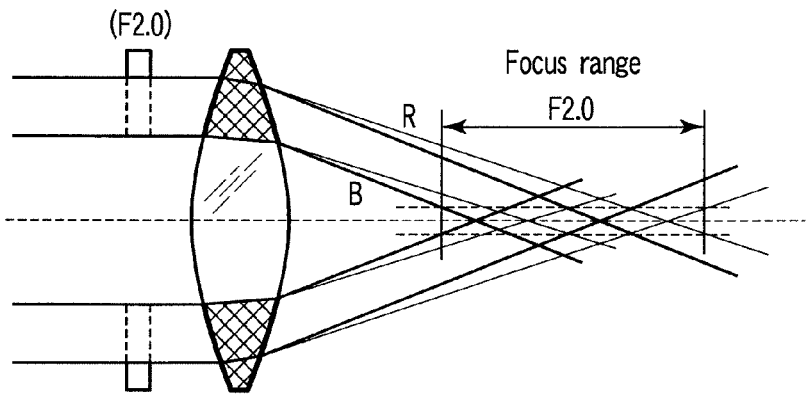
FIG. 21C is a drawing showing still another example of the lens utilized for the embodiment of the invention.

FIGS. 21A to 21C show examples of a lens structure which is utilized for the embodiment of the invention. FIG. 21A shows an image formation state of a general focal plane at an aperture of the lens of F2.8. FIG. 21B shows the case that the aperture is decreased to F2.0. Generally, when the F value is decreased, the angle between the incident light and the optical axis becomes large at the focal position. Therefore, the focal depth becomes narrow or shallow, and the distance of the object which can be well focused becomes narrow. FIG. 21c shows an example of a lens with a deepened focal depth which is especially suitable to carry out the present invention. Here, the spherical aberration of the lens is utilized. In FIG. 21c, the focal depth is deepened by setting the focal distance at the lens aperture area which expands with F2.0 from the aperture area with F2.8 longer than the focal distance at the center area. Namely, in addition to the chromatic aberration of the lens, the spherical aberration is also utilized. The spherical aberration can be embodied by forming the lens as a ring-shape or as having different focal distances in the vertical direction or the horizontal direction. Generally, when the F value of the aperture is decreased, the focal range becomes narrow. Therefore, when the lens is designed to further decrease the chromatic aberration, the number of lenses increases. With the lens shown in FIG. 21c, the chromatic aberration is conversely increased to enable the focal depth to be deepened. Therefore, since the chromatic aberration does not need to be decreased, the number of lenses can be decreased. By decreasing the number of lenses, the height of the camera module can also be lowered. Further, when the lens aperture of F2.0 is used, the amount of light which increases in proportion to the square of the F value is doubled with respect to F2.8. Thus, high sensitivity can be obtained.

Figure 22A:
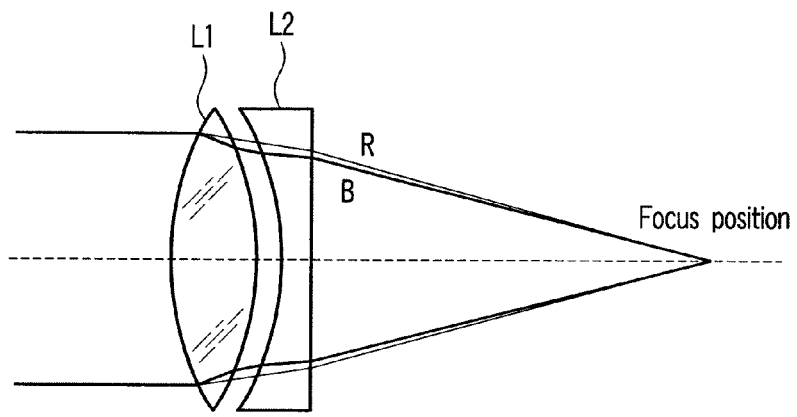
FIG. 22A is a diagram showing an example of a combined lens utilized for the embodiment of the invention.

Here, the material of the lens utilized for the present invention will be described with reference to FIGS. 22A and 22B. FIG. 22A shows a configuration of a typical achromatic lens. The achromatic lens was invented by Hall, an English mathematician, in 1733 as a method to realize color aberration reduction at the focal position by combining a lens L1 having a low refractive factor with low dispersion and a lens L2 having a high refractive factor with high dispersion. Here, high dispersion means that the refractive factor difference is large according to the wavelength difference, and low dispersion means that the refractive factor difference is small according to the wavelength difference.

Figure 22B:
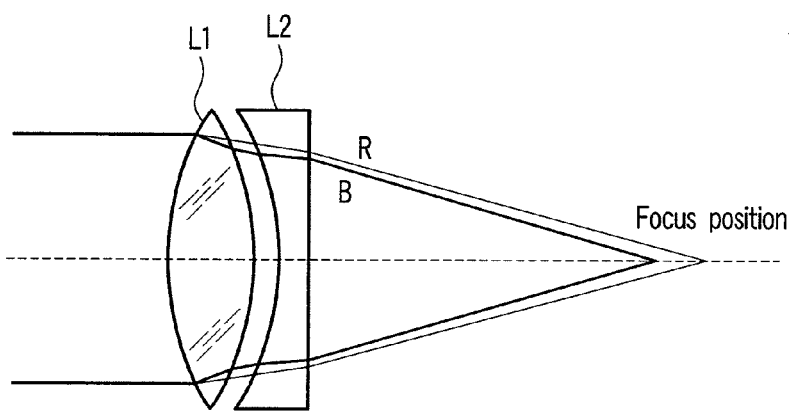
FIG. 22B is a diagram showing another example of the combined lens utilized for the embodiment of the invention.

As shown in FIG. 22B, in order to increase the chromatic aberration, the chromatic aberration can be generated by using the same material for two lenses. For example, by forming two lenses L1, L2 with a material having high refractive factor with high dispersion, the focal position from the combined lens of L1 and L2 can be shorten, and the chromatic aberration can be increased. Since the material is the same, it can be conductive to cost reduction of the material.

Figure 23:
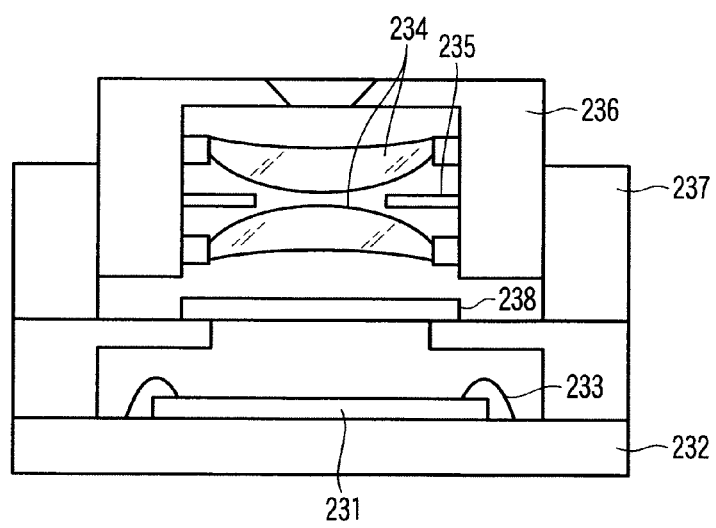
FIG. 23 is a sectional view showing an example of a module in which an image pickup device of the invention is assembled.
Figure 24:
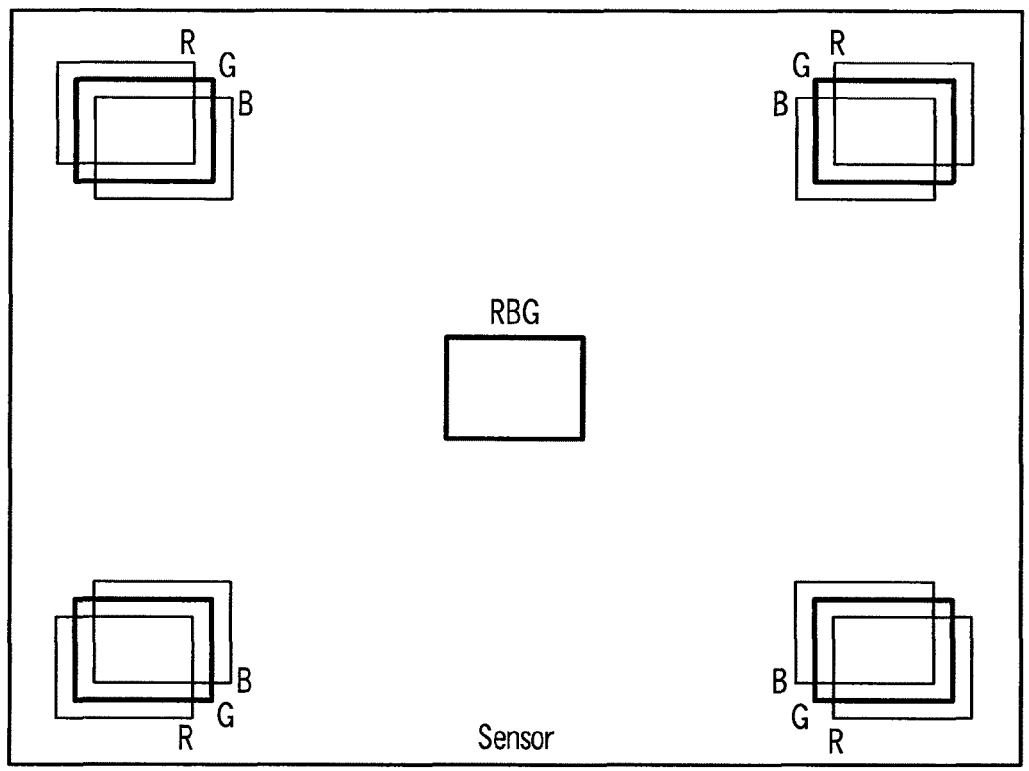
FIG. 24 is a diagram showing a state that chromatic aberration occurs at the periphery of the lens in an image in which the object is focused when utilizing a fixed focus lens.
Figure 25A:
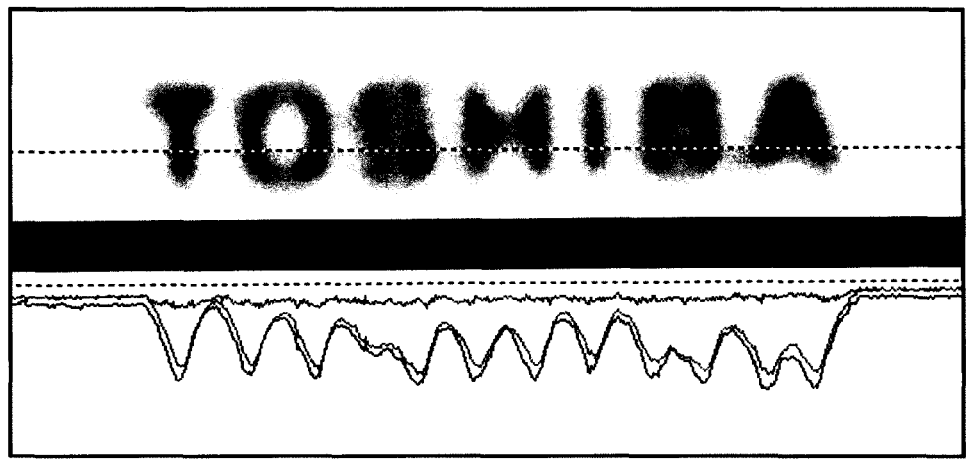
FIG. 25A is a diagram showing a defocused image and signal waves where the lens is defocused.
Figure 25B:
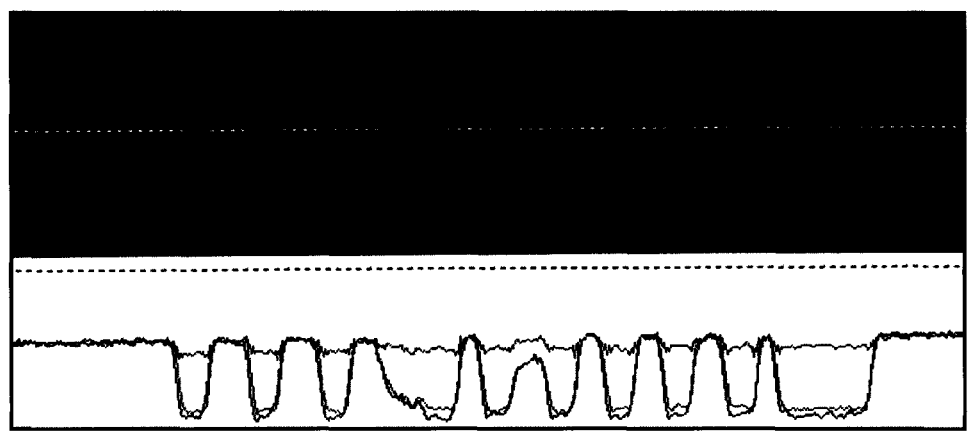
FIG. 25B is a diagram showing an image and signal waves where the lens is focused.

FIG. 23 shows a sectional view of an example of a camera module for use in a cellular phone etc. to which the present invention is adapted. A sensor chip 231 is fixed with an adhesive on a substrate 232 which is made of glass-epoxy, etc. PAD of the sensor chip 231 is connected to a terminal of the substrate 232 with a wire 233. Although not shown in figures, a connecting terminal is led to the side surface or the bottom surface of the substrate 232. At the upper part of the sensor chip 231, two optical lenses 234 made of infrared-cut (IR-cut) glass and an aperture 235 which is located between the two lenses 234 are arranged and fixed with a plastic resin on a lens barrel 236. The lens barrel 236 is fixed on a lens holder 237. Here, a IR-cut glass plate 238 can be inserted as needed between the sensor chip 231 and the lens 234. Generally, the number of the lens 234 increases as the number of pixels increases. For example, the usage of three lenses is popular when adapting 3.2 mega pixels. For example, the sensor chip 231 may be the CMOS image sensor described in the first embodiment in FIG. 1 and surrounded by a dotted line, or the image sensor of the embodiments shown in FIGS. 9, 10 and 13, or a sensor chip with an image sensor to which other function(s) is added.

In addition, each embodiment described above can not be only separately utilized, but it can also be utilized with the appropriate combination of the embodiments. Furthermore, since the above-mentioned embodiments include inventions at various stages, the inventions at various stages can be extracted by appropriately combining a plurality of structural elements disclosed in the embodiments.

Additional advantages and modifications will readily occur to those skilled in the art. Therefore, the invention in its broader aspects is not limited to the predetermined details and representative embodiments shown and described herein. Accordingly, various modifications may be made without departing from the spirit or scope of the general inventive concept as defined by the appended claims and their equivalents.

What is claimed is:

1. An image pickup device comprising:
    signal processing means for processing a W signal which is generated without performing wavelength separation and generated by separating a luminous signal into wavelength components of two or more colors by use of a sensor unit comprising two-dimensionally arranged pixels including W signal pixels and color pixels to which a wavelength separating unit for separating light wavelengths is arranged at front face of photoelectric converting element which convert the luminous signal condensed by an optical lens into electric signals, wherein
    each area of light receiving surfaces of the two-dimensionally arranged pixels are the same for all the W signal pixels and color pixels; and
    the wavelength separating unit is constituted of micro-lenses each of which condenses light for each pixel and color filter layers which separate light wavelengths, and a micro-lens corresponding to the W signal to which a filter layer which does not separate light wavelengths is formed to be smaller in size than the micro-lenses to which color filter layers are arranged.

2. The image pickup device according to claim 1, wherein the color filter layers each is formed to be the same size as the each micro-lens.

3. The image pickup device according to claim 1, wherein the micro-lens having a large area is formed to have a large curvature, and the micro-lens having a small area is formed to have a small curvature.

4. The image pickup device according to claim 3, wherein the micro-lens having a large area is formed through at least two process steps.

5. The image pickup device according to claim 1, wherein the signal processing means comprises outline signal generating means for generating an outline signal from an addition signal obtained by adding a color signal of one center pixel and color signals of a plurality of peripheral pixels in accordance with a predetermined weighting in a predetermined pixel array which includes the one center pixel at a position in the sensor unit and the plurality of peripheral pixels thereof.

6. The image pickup device according to claim 5, wherein the signal processing means comprises defocus correcting means for correcting image defocus by correcting a signal changing part of the addition signal.

7. The image pickup device according to claim 6, wherein the defocus correcting means comprises:
    signal inclination determining means for detecting the signal change of the addition signal by a predetermined criterion; and
    signal replacing means for replacing the addition signal with a peripheral signal having a smaller signal change than that of the addition signal based on a detection result of the signal inclination determining means.

8. The image pickup device according to claim 1, wherein the optical lens comprises a lens material with high dispersion for making a refractive factor difference be large according to an incident light wavelength difference thereby to make a focal position difference of the optical lens large.

* * * * *